(12) United States Patent
Yang et al.

(10) Patent No.: US 11,271,181 B1
(45) Date of Patent: Mar. 8, 2022

(54) ELECTRONIC DISPLAY VISUAL ARTIFACT MITIGATION

(71) Applicant: Apple Inc., Cupertino, CA (US)

(72) Inventors: Maofeng Yang, Santa Clara, CA (US); Weijun Yao, Saratoga, CA (US); Jiayi Jin, Redwood City, CA (US); Paolo Sacchetto, Cupertino, CA (US); Injae Hwang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 68 days.

(21) Appl. No.: 16/576,615

(22) Filed: Sep. 19, 2019

Related U.S. Application Data

(60) Provisional application No. 62/734,836, filed on Sep. 21, 2018.

(51) Int. Cl.
| | |
|---|---|
| *H01L 27/146* | (2006.01) |
| *H01L 51/50* | (2006.01) |
| *G09G 3/3233* | (2016.01) |
| *G09G 3/14* | (2006.01) |
| *H01L 27/15* | (2006.01) |
| *H01L 27/28* | (2006.01) |

(52) U.S. Cl.
CPC .......... *H01L 51/5012* (2013.01); *G09G 3/14* (2013.01); *G09G 3/3233* (2013.01); *H01L 27/14609* (2013.01); *H01L 27/156* (2013.01); *H01L 27/28* (2013.01); *G09G 2300/0439* (2013.01); *G09G 2320/0247* (2013.01); *G09G 2330/02* (2013.01)

(58) Field of Classification Search
CPC ......... H01L 27/14601; H01L 27/14609; H01L 27/14612; H01L 27/156; H01L 27/28; H01L 31/143; H01L 33/0041; H01L 51/50; H01L 51/5012; G09G 3/14; G09G 3/32; G09G 3/3208; G09G 3/3233; G09G 2300/00439; G09G 2320/0247; G09G 2330/02

See application file for complete search history.

(56) References Cited

U.S. PATENT DOCUMENTS

| | | | |
|---|---|---|---|
| 8,441,503 B2 * | 5/2013 | Isobe | G09G 3/22 |
| | | | 345/690 |
| 10,304,378 B2 * | 5/2019 | Lin | G09G 3/3233 |
| 10,692,434 B2 * | 6/2020 | Zhang | G09G 3/3266 |
| 10,741,121 B2 * | 8/2020 | Lin | G09G 3/3233 |
| 10,854,139 B2 * | 12/2020 | Lin | G09G 3/3233 |

(Continued)

*Primary Examiner* — Shaun M Campbell
(74) *Attorney, Agent, or Firm* — Fletcher Yoder, P.C.

(57) ABSTRACT

An electronic display having pixels and control circuitry to drive the pixels to display image data even during relatively long presentation times without visual artifacts, such as flicker, are provided. The control circuitry may cause the pixel to perform a threshold voltage sampling and pixel programming phase to store image data for the pixel while accounting for a first threshold voltage of the first transistor. Afterward, an on-bias stress phase may cause a threshold voltage of the first transistor of the plurality of transistors to reach a second threshold voltage. Following the on-bias stress phase, a first emission phase may cause the light-emitting diode to emit light in accordance with the image data, and subsequent on-bias stress phases and subsequent emission phases for the duration of the presentation time may take place without a visible flicker artifact.

20 Claims, 33 Drawing Sheets

(56) References Cited

U.S. PATENT DOCUMENTS

| | | | |
|---|---|---|---|
| 2011/0279435 A1* | 11/2011 | Tsai | G09G 3/3233 345/212 |
| 2013/0100173 A1* | 4/2013 | Chaji | G09G 3/3275 345/690 |
| 2014/0306867 A1* | 10/2014 | Qing | G09G 3/3233 345/76 |
| 2016/0117989 A1* | 4/2016 | Kumeta | G09G 3/3258 345/212 |
| 2017/0018229 A1 | 1/2017 | Zhang et al. | |
| 2017/0162098 A1* | 6/2017 | Cheon | G09G 3/3233 |
| 2017/0263183 A1* | 9/2017 | Lin | G09G 3/3233 |
| 2018/0075801 A1 | 3/2018 | Le et al. | |
| 2018/0204541 A1 | 7/2018 | Chaji et al. | |
| 2018/0268762 A1* | 9/2018 | Lin | G09G 3/3291 |
| 2018/0315374 A1 | 11/2018 | Zhang et al. | |
| 2018/0350286 A1 | 12/2018 | Lee et al. | |
| 2018/0357963 A1* | 12/2018 | Gai | G09G 3/3258 |
| 2020/0027402 A1* | 1/2020 | Xiao | G09G 3/3258 |

\* cited by examiner

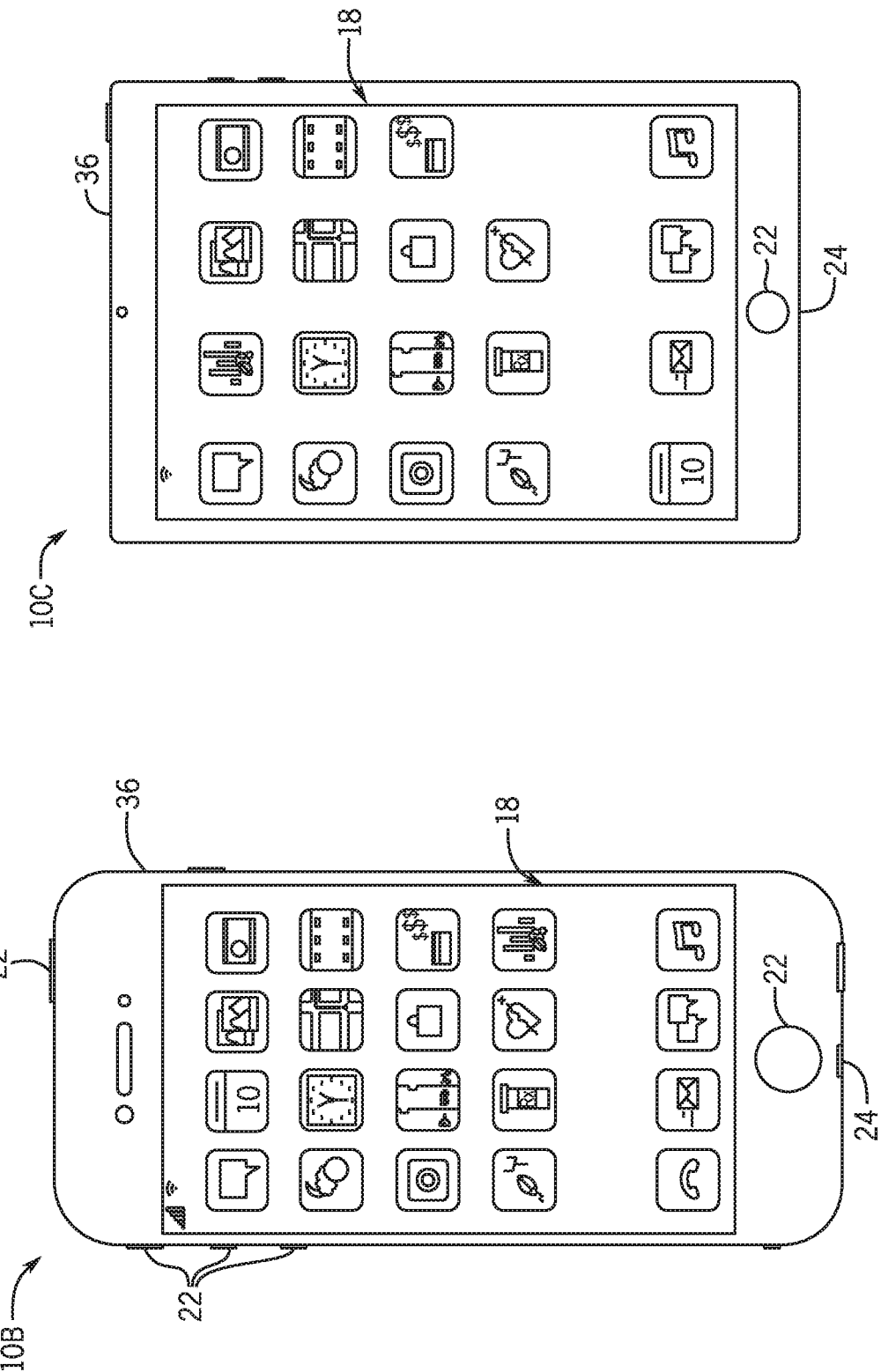

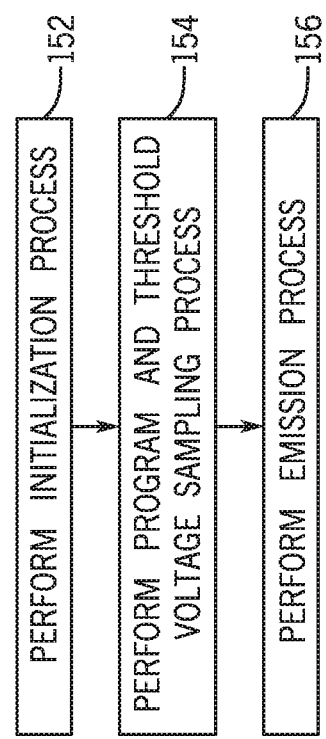
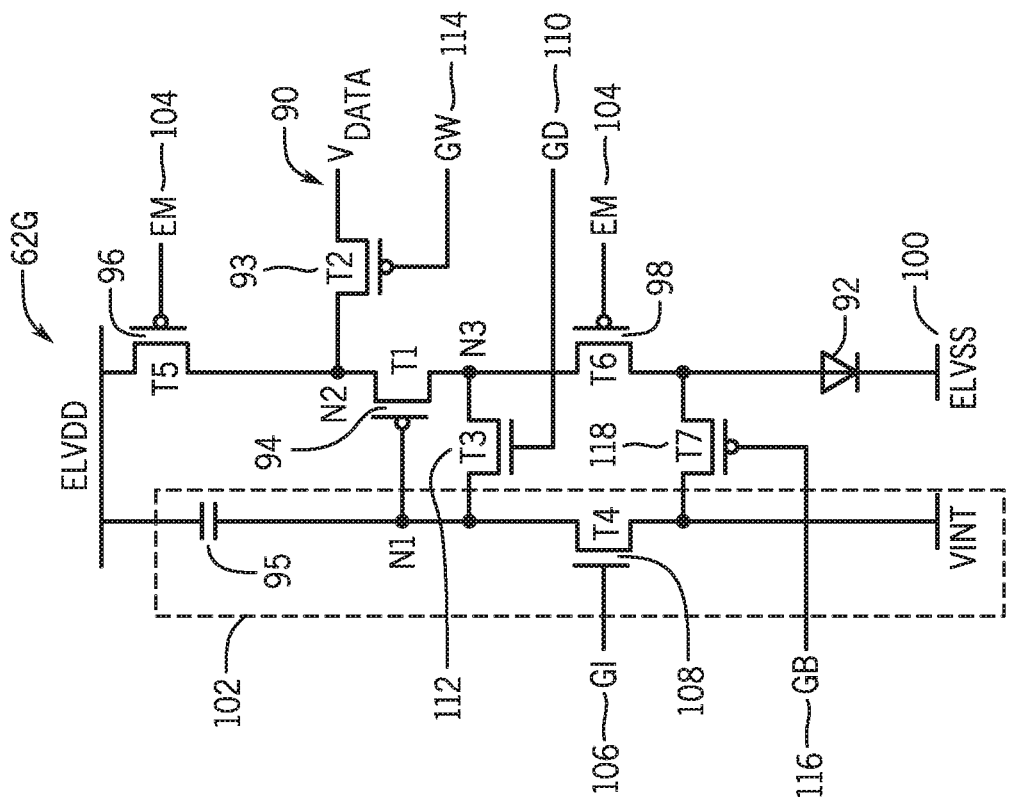

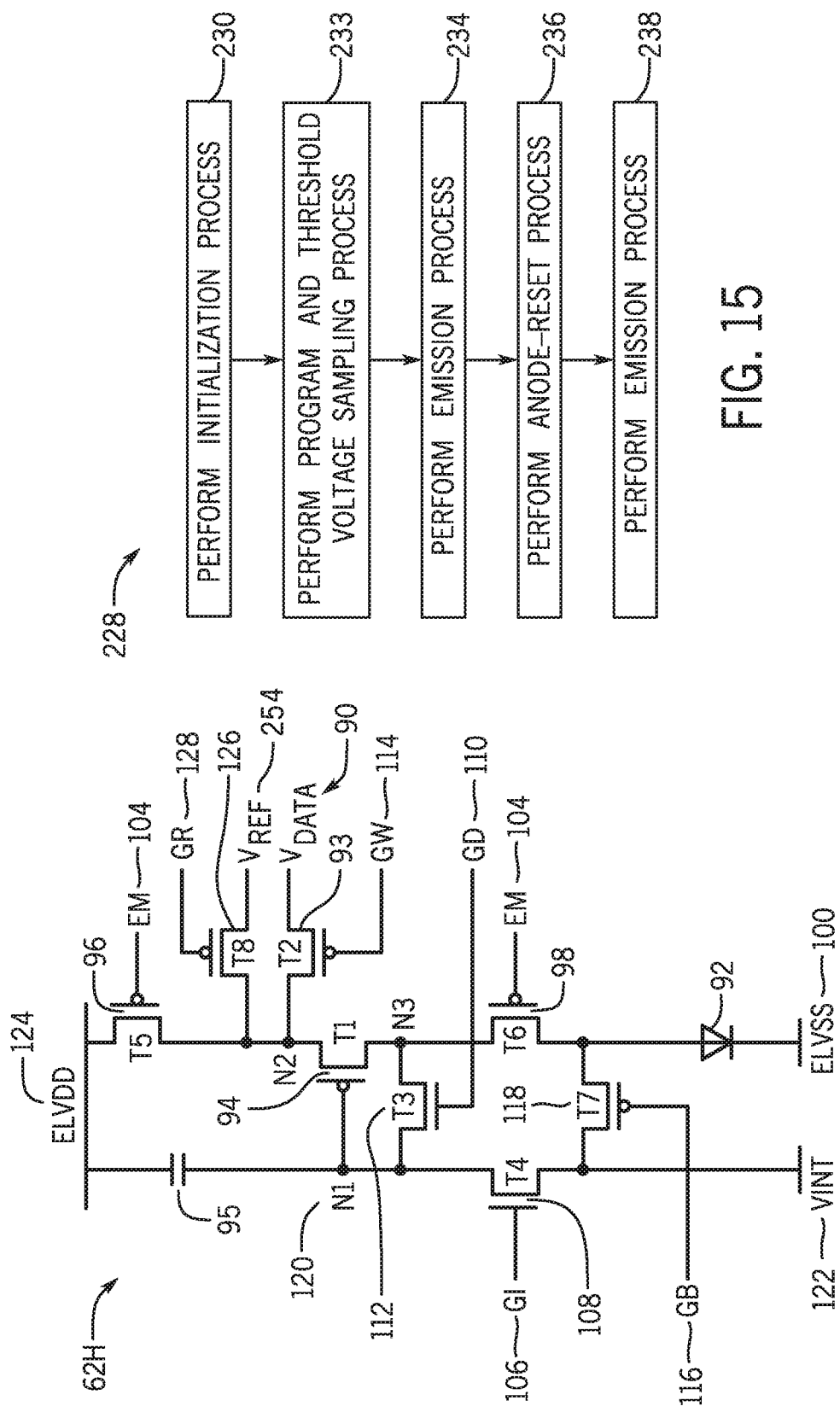

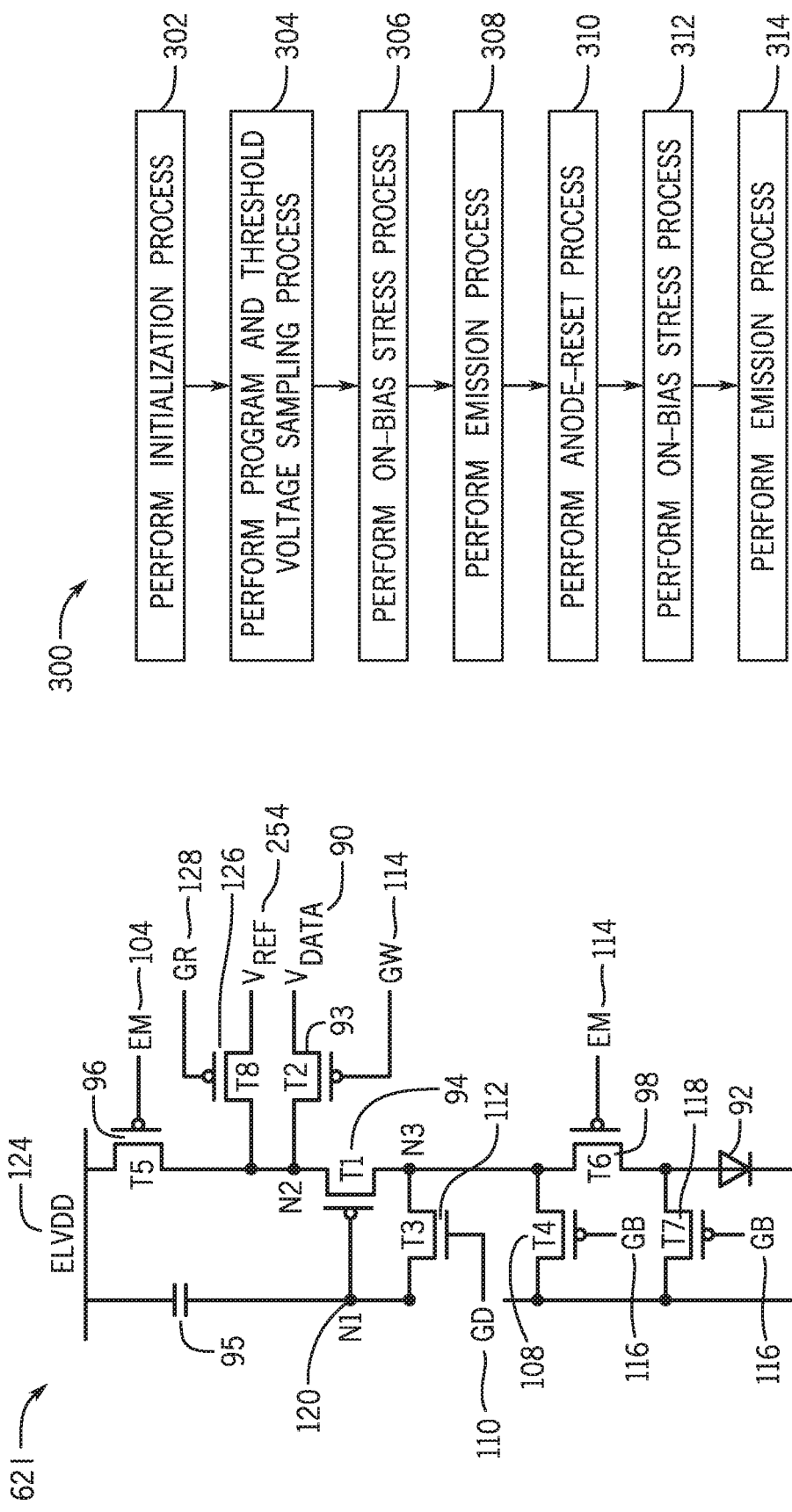

ELECTRONIC DISPLAY VISUAL ARTIFACT MITIGATION

CROSS-REFERENCE TO RELATED APPLICATIONS

This application claims priority to U.S. Provisional Patent Application No. 62/734,836, entitled "ELECTRONIC DISPLAY VISUAL ARTIFACT MITIGATION," filed on Sep. 21, 2018, which is incorporated herein by reference in its entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Electronic displays are found in numerous electronic devices, from mobile phones to computers, televisions, automobile dashboards, and many more. Electronic displays operate by emitting light from individual included in the display. Displays may also function at a refresh rate, which refers to how frequently data displayed by the pixels is updated. For instance, content to be displayed on a display may be defined in frames, or individual images of content. Data may be transmitted to the pixels of a display so that the pixels emit light corresponding to an image defined by the data. In some cases, as the pixels are refreshed with new data and caused to emit light in accordance with the new data, visual artifacts, such as flickering, may be perceived by the human eye. These artifacts may be worse for lower refresh rates.

This disclosure describes self-emitting pixels and methods for controlling the self-emitting pixels that mitigate visual artifacts, particularly for displays operating at relatively low refresh rates, such as refresh rates of ten hertz or less than ten hertz. Visual artifacts, such as flickering, may be perceived by the human eye due to various reasons. For example, in some cases when pixels emit light, stop emitting light, and emit light again (e.g., based on image data) visual artifacts may occur. As described herein, pixels may be refreshed to be prepared to display content indicated by image data. The pixels may emit light based on the image data, and before refreshing the pixels to display new data, a reset may be performed. During the reset, the pixels may cease to emit light. After the reset, the pixels may emit light in accordance with the same image data. More specifically, when a pixel is refreshed, a threshold voltage of a transistor included in the pixel reaches a first threshold voltage value, and when the pixel is reset, the threshold voltage of the transistor is brought to a second threshold voltage value that is the same or substantially the same as the first threshold voltage value. By providing a first and second threshold voltage that are equivalent or nearly equivalent, visual artifacts are imperceptible to the human eye.

BRIEF DESCRIPTION OF THE DRAWINGS

Various aspects of this disclosure may be better understood upon reading the following detailed description and upon reference to the drawings in which:

FIG. 3 is a front view of a hand-held device representing another embodiment of the electronic device of FIG. 1;

FIG. 4 is a front view of another hand-held device representing another embodiment of the electronic device of FIG. 1;

FIG. 8 is a circuit diagram of a self-emissive pixel of the display of FIG. 7, in accordance with an embodiment;

FIG. 9 is a flow diagram of a process of operating the self-emissive pixel of FIG. 8, in accordance with an embodiment;

FIG. 14 is a circuit diagram of a self-emissive pixel of the display of FIG. 7, in accordance with an embodiment;

FIG. 15 is a flow diagram of a process of operating the self-emissive pixel of FIG. 14, in accordance with an embodiment;

FIG. 20 is a circuit diagram of a self-emissive pixel of the display of FIG. 7, in accordance with an embodiment;

FIG. 21 is a flow diagram of a process of operating the self-emissive pixel of FIG. 20, in accordance with an embodiment;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Embodiments of the present disclosure relate to systems and methods for pixel circuitry that may be used to extend mitigate visual artifacts that may occur in displays, especially displays operating at relatively low refresh rates, such as fresh rates of ten hertz or less than ten hertz. As discussed below a self-emissive pixel may include a light-emitting diode (LED). An organic light-emitting diode (OLED) represents one type of LED that may be found in the self-emissive pixel, but other types of LEDs may also be used. The systems and methods of this disclosure perform an on-bias stress after new data has been transmitted through the pixel. For instance, during a refresh, new image data may be implemented into a pixel. The LED of the pixel may emit light in accordance with the data. Before a subsequent refresh, the pixel may be reset, meaning the LED may no longer emit light. Additionally, the present disclosure also relates to techniques that may be applied during the reset to alter a threshold voltage of a transistor included in the pixel. Subsequently, the LED may be caused to emit light again still before a refresh occurs. As discussed below, by altering the threshold voltage of the transistor, light may be emitted from a reset in the same or nearly identical manner as occurred in relation with a refresh, which may reduce the occurrence of image artifacts on the LED pixels perceptible to the human eye.

Figure 1:
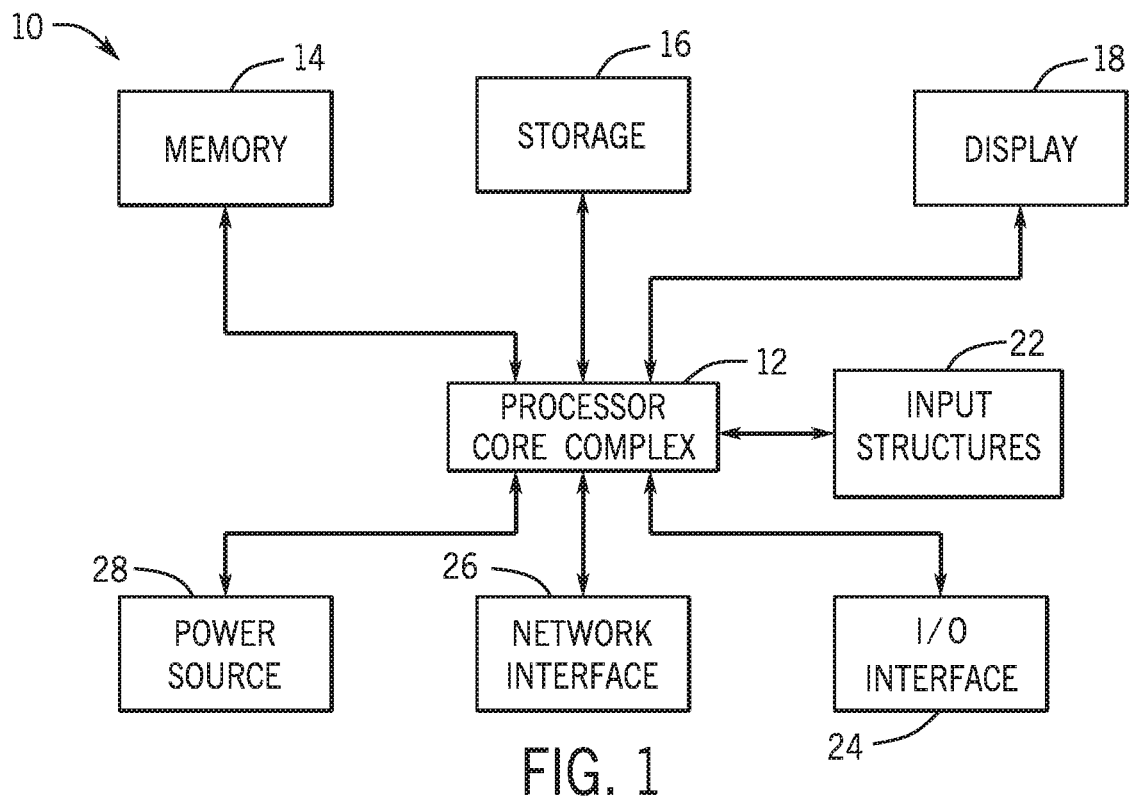
FIG. 1 is a schematic block diagram of an electronic device, in accordance with an embodiment.
Figure 2:
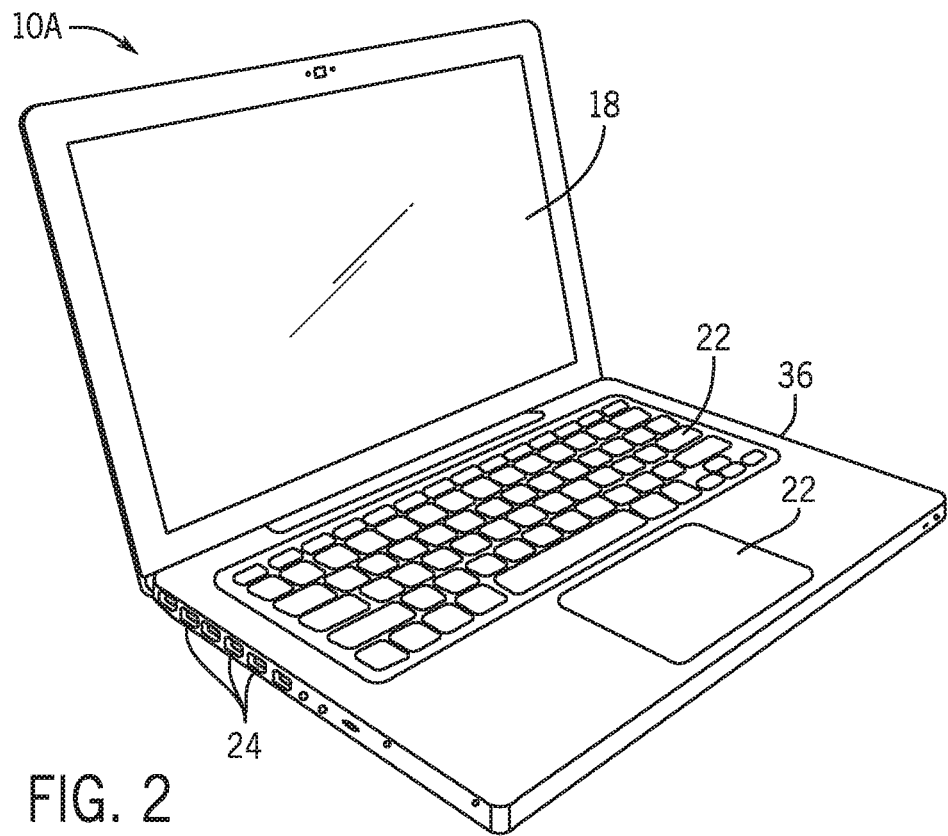
FIG. 2 is a perspective view of a notebook computer representing an embodiment of the electronic device of FIG. 1.
Figure 5:
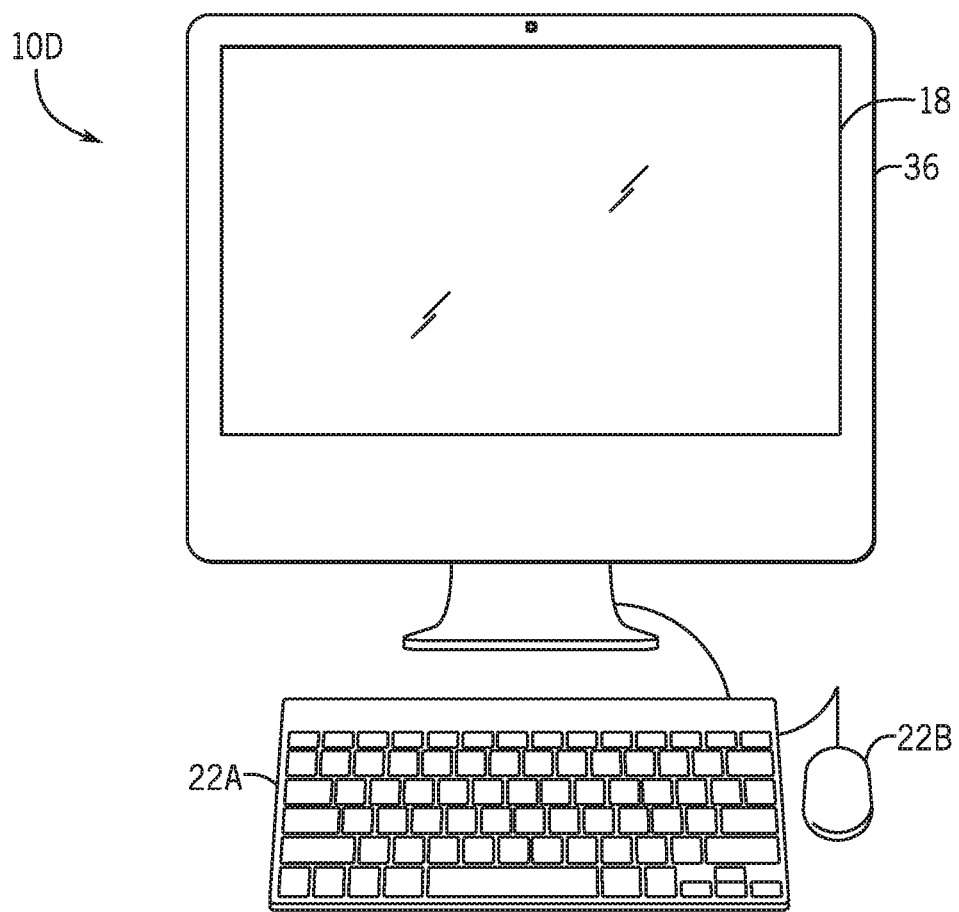
FIG. 5 is a front view of a desktop computer representing another embodiment of the electronic device of FIG. 1.
Figure 6:
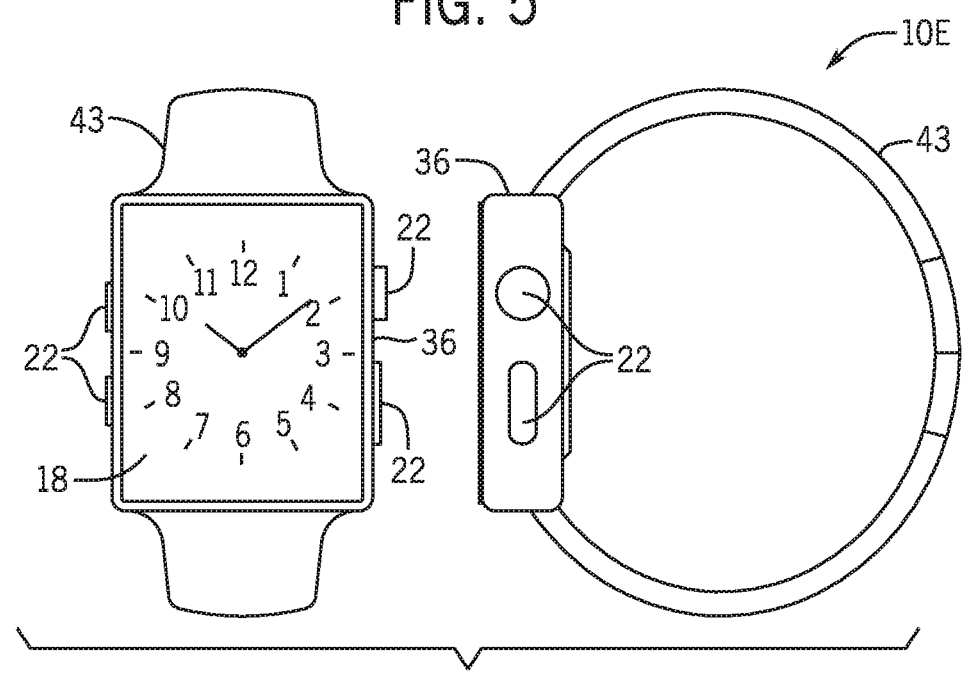
FIG. 6 is a front view and side view of a wearable electronic device representing another embodiment of the electronic device of FIG. 1.

With this in mind, a block diagram of an electronic device 10 is shown in FIG. 1. As will be described in more detail below, the electronic device 10 may represent any suitable electronic device, such as a computer, a mobile phone, a portable media device, a tablet, a television, a virtual-reality headset, a vehicle dashboard, or the like. The electronic device 10 may represent, for example, a notebook computer 10A as depicted in FIG. 2, a handheld device 10B as depicted in FIG. 3, a handheld device 10C as depicted in FIG. 4, a desktop computer 10D as depicted in FIG. 5, a wearable electronic device 10E as depicted in FIG. 6, or a similar device.

The electronic device 10 shown in FIG. 1 may include, for example, a processor core complex 12, a local memory 14, a main memory storage device 16, an electronic display 18, input structures 22, an input/output (I/O) interface 24, network interfaces 26, and a power source 28. The various functional blocks shown in FIG. 1 may include hardware elements (including circuitry), software elements (including machine-executable instructions stored on a tangible, non-transitory medium, such as the local memory 14 or the main memory storage device 16) or a combination of both hardware and software elements. It should be noted that FIG. 1 is merely one example of a particular implementation and is intended to illustrate the types of components that may be present in electronic device 10. Indeed, the various depicted components may be combined into fewer components or separated into additional components. For example, the local memory 14 and the main memory storage device 16 may be included in a single component.

The processor core complex 12 may carry out a variety of operations of the electronic device 10, such as provide image data for display on the electronic display 18. The processor core complex 12 may include any suitable data processing circuitry to perform these operations, such as one or more microprocessors, one or more application specific processors (ASICs), or one or more programmable logic devices (PLDs). In some cases, the processor core complex 12 may execute programs or instructions (e.g., an operating system or application program) stored on a suitable article of manufacture, such as the local memory 14 and/or the main memory storage device 16. In addition to instructions for the processor core complex 12, the local memory 14 and/or the main memory storage device 16 may also store data to be processed by the processor core complex 12. By way of example, the local memory 14 may include random access memory (RAM) and the main memory storage device 16 may include read only memory (ROM), rewritable non-volatile memory such as flash memory, hard drives, optical discs, or the like.

The electronic display 18 may display image frames, such as a graphical user interface (GUI) for an operating system or an application interface, still images, or video content. The processor core complex 12 may supply at least some of the image frames. The electronic display 18 may be a self-emissive display, such as an organic light emitting diodes (OLED) display, or may be a liquid crystal display (LCD) illuminated by a backlight. In some embodiments, the electronic display 18 may include a touch screen, which may allow users to interact with a user interface of the electronic device 10. The electronic display 18 may employ display panel sensing to identify operational variations of the electronic display 18. This may allow the processor core complex 12 or the electronic display 18 to adjust image data that is sent to the electronic display 18 to compensate for these variations, thereby improving the quality of the image frames appearing on the electronic display 18.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. The network interface 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a cellular network. The network interface 26 may also include interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra wideband (UWB), alternating current (AC) power lines, and so forth. The power source 28 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, an electronic display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on the electronic display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the electronic display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal serial bus (USB), or other similar connector and protocol.

User input structures 22, in combination with the electronic display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer or portable computing device. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the electronic display 18. In certain embodiments, a user of the computer 10D may interact with the computer 10D using various peripheral input devices, such as input structures 22A or 22B (e.g., keyboard and mouse), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 43, may be an Apple Watch® by Apple Inc. However, in other embodiments, the wearable electronic device 10E may include any wearable electronic device such as, for example, a wearable exercise monitoring device (e.g., pedometer, accelerometer, heart rate monitor), or other device by another manufacturer. The electronic display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

Figure 7:
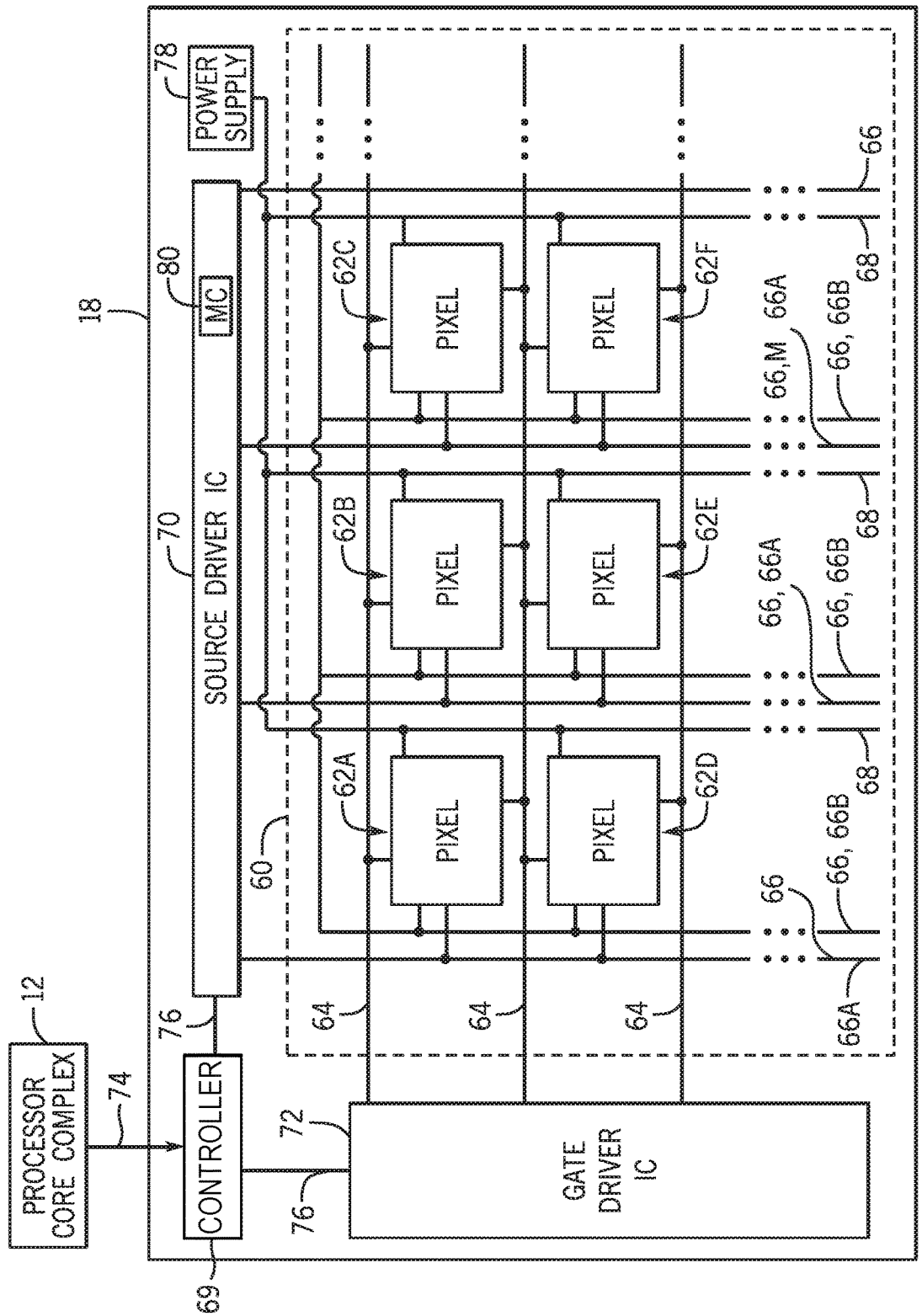
FIG. 7 is a circuit diagram illustrating a portion of an array of pixels of the display of FIG. 1, in accordance with an embodiment.

The electronic display 18 for the electronic device 10 may include a matrix of pixels that contain light-emitting circuitry. Accordingly, FIG. 7 illustrates a circuit diagram including a portion of a matrix of pixels in an active area of the electronic display 18. As illustrated, the electronic display 18 may include a display panel 60. Moreover, the display panel 60 may include multiple unit pixels 62 (here, six unit pixels 62A, 62B, 62C, 62D, 62E, and 62F are shown) arranged as an array or matrix defining multiple rows and columns of the unit pixels 62 that collectively form a viewable region of the electronic display 18, in which an image may be displayed. In such an array, each unit pixel 62 may be defined by the intersection of rows and columns, represented here by the illustrated gate lines 64 (also referred to as "scanning lines") and data lines 66 (also referred to as "source lines"), respectively. Additionally, power supply lines 68 may provide power to each of the unit pixels 62 (e.g., from power supply 78). The unit pixels 62 may include, for example, a thin film transistor (TFT) coupled to a self-emissive pixel, such as an OLED, whereby the TFT may be a driving TFT that facilitates control of the luminance of a display pixel 62 by controlling a magnitude of supply current flowing into the OLED of the display pixel 62 or a TFT that controls luminance of a display pixel by controlling the operation of a liquid crystal.

Although only six unit pixels 62, referred to individually by reference numbers 62A-62F, respectively, are shown, it should be understood that in an actual implementation, each data line 66 and gate line 64 may include hundreds or even thousands of such unit pixels 62. By way of example, in a color display panel 60 having a display resolution of 1024× 768, each data line 66, which may define a column of the pixel array, may include 768 unit pixels, while each gate line 64, which may define a row of the pixel array, may include 1024 groups of unit pixels with each group including a red, blue, and green pixel, thus totaling 3072 unit pixels per gate line 64. It should be readily understood, however, that each row or column of the pixel array any suitable number of unit pixels, which could include many more pixels than 1024 or 768. In the presently illustrated example, the unit pixels 62 may represent a group of pixels having a red pixel (62A), a blue pixel (62B), and a green pixel (62C). The group of unit pixels 62D, 62E, and 62F may be arranged in a similar manner. Additionally, in the industry, it is also common for the term "pixel" may refer to a group of adjacent different-colored pixels (e.g., a red pixel, blue pixel, and green pixel), with each of the individual colored pixels in the group being referred to as a "sub-pixel." In some cases, however, the term "pixel" refers generally to each sub-pixel depending on the context of the use of this term.

As illustrated, the electronic display 18 may include an array of pixels 62 (e.g., self-emissive pixels). The electronic display may include any suitable circuitry to drive the pixels 62. In the example of FIG. 7, the electronic display 18 includes a controller 69, a source driver integrated circuit (IC) 70, and a gate driver IC 72. The source driver IC 70 and gate driver IC 72 may drive individual of the self-emissive pixels 82. In some embodiments, the source driver IC 70 and the gate driver IC 72 may include multiple channels for independently driving multiple of the self-emissive pixel 82. Each of the pixels 62 may include any suitable light-emitting element, such as a LED, one example of which is an OLED. However, any other suitable type of pixel, including non-self-emissive pixels (e.g., liquid crystal, digital micromirror) may also be utilized.

The controller 69, which may include a chip, such as a processor or application specific integrated circuit (ASIC), that controls various aspects (e.g., operation) of the electronic display 18 and/or the display panel 60. For instance, the controller 69 may receive image data 74 from the processor core complex indicative of light intensities for the light outputs for the pixels 62. In some embodiments, the controller 69 may be coupled to the local memory 14 and retrieve the image data 74 from the local memory 14. The controller 69 may control the pixels 62 by using control signals to control elements of the pixels 62. For instance, the pixels 62 may include any suitable controllable element, such as a transistor, one example of which is a MOSFET. The pixels 62, which may be self-emissive, may include any suitable controllable element, such as a transistor, one example of which is a MOSFET. However, any other suitable type of controllable elements, including thin film transistors (TFTs), p-type and/or n-type MOSFETs, and other transistor types, may also be used. The controller 69 may control elements of the pixels 62 via the source driver IC70 and the gate driver IC 72. For example, the controller 69 may send signals to the source driver IC 70, which may send signals (e.g., timing information/image signals 76) to the pixels 62. The gate driver IC 72 may provide/remove gate activation signals to activate/deactivate rows of unit pixels 62 via the gate lines 64 based on timing information/image signals 76 received from the controller 69.

In some embodiments, the controller 69 may be included in the source driver IC 70. Additionally, the controller 69 or source driver IC 70 may include a timing controller (TCON) that determines and sends the timing information/image signals 76 to the gate driver IC 72 to facilitate activation and deactivation of individual rows of unit pixels 62. In other embodiments, timing information may be provided to the gate driver IC 72 in some other manner (e.g., using a controller 80 that is separate from or integrated within the source driver IC 70). Further, while FIG. 7 depicts only a controller 69 and a single source driver IC 70, it should be appreciated that other embodiments may utilize multiple controllers 69 and/or multiple source driver ICs 70 to provide timing information/image signals 76 to the unit pixels 62. For example, additional embodiments may include multiple controller 69 and/or multiple source driver ICs 70 disposed along one or more edges of the display panel 60, with each controller 69 and/or source driver IC 70 being configured to control a subset of the data lines 66 and/or gate lines 64.

FIG. 8 illustrates an example of the described self-emissive pixel 62. The self-emissive pixel 62G in FIG. 8 may include a DATA terminal 90 (e.g., data input terminal) to receive a programming voltage. The controller 69 may use the programming voltage in conjunction with control signals transmitted to controllable elements of the self-emissive pixel 62G to control the light emitted from the self-emissive pixel 62G. The programming voltage may correspond to the luminosity (e.g., level of light emitted, measure of light emission) of a light-emitting diode (LED) 92 (e.g., an organic light-emitting diode (OLED)) of the self-emissive pixel 62G. The programming voltage transmitted through the DATA terminal 90 may transmit to a transistor 93 to enable transmission through the pixel 62G. The controller 69 may control the transmission of the signals through activation of the transistor 93 via a control signal.

If the controller 69 activates the transistor 93, the programming voltage may transmit to the gate of a transistor 94 (e.g., driving transistor) used in LED driving. A capacitor 95 coupled to a gate of the transistor 94 may store the image data for the pixel. The transistor 94 may activate in response to the activation of transistors 96, 98 responsible for enabling emission, causing a driving current to transmit through to the LED 92. The value of the driving current changes based on the programming voltage transmitted to the gate of the transistor 94. In this way, the controller 69 may change a luminosity of the LED 92.

If activated by the controller 69, the transistors 96, 98 may cause signals to transmit through the LED 92. As such, the controller 69 may control the emission of light from the self-emissive pixel 62G through the transmission of the driving current to the LED 92 through enabling the transistors 96, 98. The controller 69 may apply a control signal to activate the transistors 96, 98. Signals may transmit through the transistors 96, 98 to the LED 92 and may cause light to emit from the LED 92 in response to the control signal. The LED 92 may conduct if the voltage difference across the anode of the LED 92 and an electroluminescence source voltage (ELVSS) 100 (e.g., a ground and/or reference voltage), is greater than the threshold voltage for the LED 92, where the threshold voltage for the LED 92 may represent a voltage value at which light emits from the LED 92.

An initialization process may facilitate in controlling the emission of light from the self-emissive pixel 62G. The controller 69 may use an initializing circuit portion 102 (e.g., initialization circuit or circuitry) to perform the initialization process. Initializing the self-emissive pixel 62G may help to clear residual signals from the self-emissive pixel 62G and may improve a representation of signals transmitted to the self-emissive pixel 62G in the light emitted by the LED 92. The improved representation may reduce occurrences of image artifacts on the electronic display 18.

Furthermore, as described below in greater detail, the controller 69 may alter signals applied to gates of transistors included in the self-emissive pixel 62G to control operation of the self-emissive pixel 62G. For example, an emission signal 104 may be sent to cause the self-emissive pixel 62G to emit light via the LED 92. As another example, an initialization signal 106 may be utilized in conjunction with a gate of an initialization transistor 108 to initiate and terminate the initialization process. As yet another example, a driving signal 110 may be applied to a transistor 112. Furthermore, a write signal 114 may be applied to the transistor 93 to control when the self-emissive pixel 62G utilizes data provided by the DATA terminal 90. Additionally, a bypass signal 116 may be applied to a bypass transistor 118.

FIG. 9 illustrates a process 150 that the controller 69 follows in operating the self-emissive pixel 62G. The process 150 in FIG. 9 includes performing an initialization process (process block 152), performing a program and threshold voltage sampling process (process block 154), and performing an emission process (process block 156).

To elaborate, to extend the data range of the self-emissive pixel 62G, the controller 69 may perform an initialization process (process block 152). In the initialization process, the controller 69 may disable some control signals and may enable some control signals to prepare the self-emissive pixel 62G to emit light associated with data that will be indicated by the DATA terminal 90. For instance, the initialization process may help to clear residual signals from the self-emissive pixel 62G from a previous data transmission and may prepare the self-emissive pixel 62G for emission of light for a next data transmission. Clearing residual signals from the previous data transmission may improve representation of signals transmitted to self-emissive pixel 62G to emit as light from the LED 92.

Figure 10:
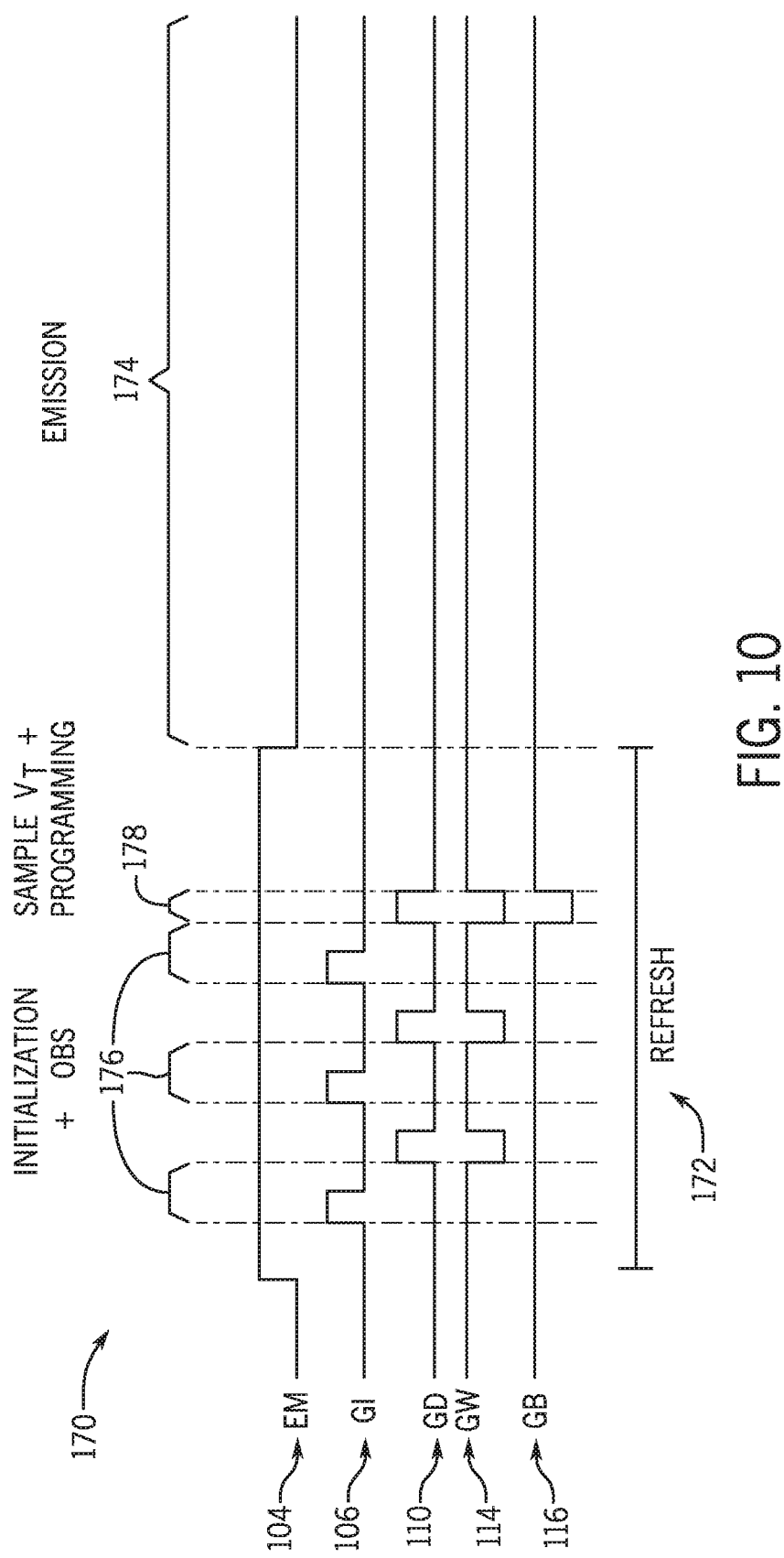
FIG. 10 is a timing diagram of signals transmitted through the self-emissive pixel of FIG. 8 during implementation of the process of FIG. 9, in accordance with an embodiment.

FIG. 10 illustrates a timing diagram 170 that illustrates how signals from the controller 69 may be applied to perform the process 150 on the self-emissive pixel 62G. In particular, the timing diagram 170 illustrates when the signals sent by the controller 69 are sent with the respect to each portion of the process 150.

The timing diagram 170 includes two general time periods: a refresh period 172 and an emission period 174. The refresh period 172 generally refers to a time when the LED 92 of the self-emissive pixel 62G does not emit light. During the refresh period 172, pixel data may be reset to enable to LED 92 to provide a luminosity associated with a later portion of content that is displayed on a display that may be associated with the self-emissive pixel 62G, such as the electronic display 18 of FIGS. 2-4. For example, the electronic display 18 may have a refresh rate that describes how often the self-emissive pixels 62G of the electronic display 18 can be updated to display new pixel data. For instance, if the electronic display 18 were to have a refresh rate of one hertz, the self-emissive pixels 62G would be refreshed once per second. As another example, if the electronic display 18 were to have a refresh rate of 120 hertz, the self-emissive pixels 62G may be refreshed 120 times per second. In some cases, the refresh rate of the electronic display 18 may be adjustable, meaning that the electronic display 18 may change the frequency at which the self-emissive pixels 62G are refreshed.

The refresh period 174 include initialization and on-bias stress periods 176, which correspond to performance of the initialization process (process block 152) of FIG. 9. As illustrated in the timing diagram 170, during initialization and on-bias stress periods 176, the initialization signal 106 is sent to help clear residual signals from the self-emissive pixel 62G from a previous data transmission and may prepare the self-emissive pixel 62G for emission of light for a next data transmission.

Figure 11:
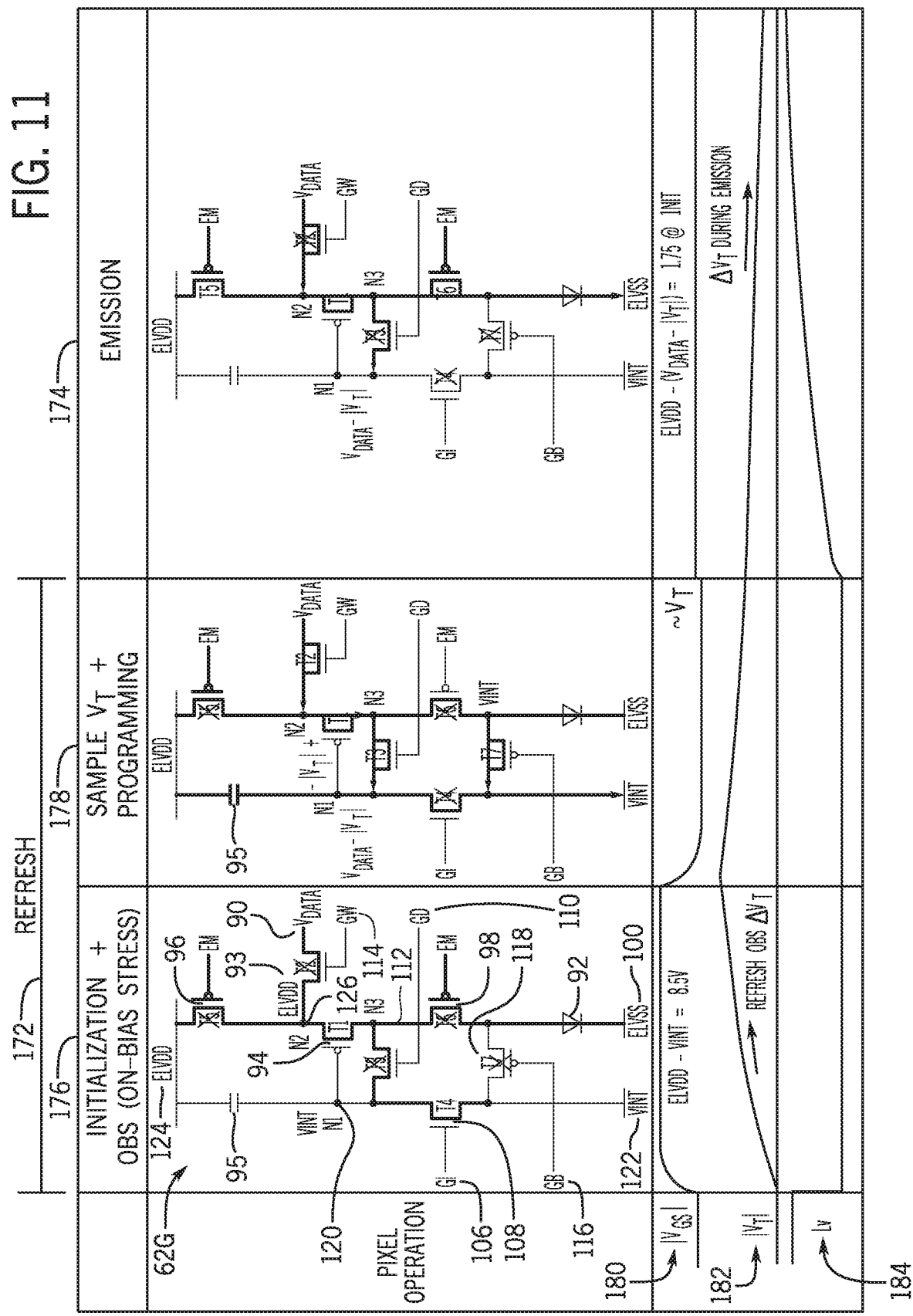
FIG. 11 illustrates circuit diagrams of the self-emissive pixel of FIG. 8 during implementing portions of the process of FIG. 9, in accordance with an embodiment.

To help illustrate, FIG. 11 illustrates the self-emissive pixel 62G during the initialization and on-bias stress period 176, programming and threshold voltage sampling period 178, and the emission period 174. As illustrated by the self-emissive pixel associated with the initialization and on-bias stress period 176, and a current may flow between a first node 120 and the source of an initialization voltage (VINT) 122.

FIG. 11 also illustrates an absolute value of a gate-source voltage ($V_{GS}$) 180 of the transistor 94, an absolute value of a threshold voltage ($V_T$) 182 associated with the transistor 94, and a luminance 184 associated with the self-emissive pixel 62G (e.g., an intensity of light emitted by the LED 92) with respect to time. During the initialization and on-bias stress period 176, the $V_{GS}$ 180 may be equal to a difference between an electroluminescence source voltage (ELVDD) 124 and the VINT 122. The $V_T$ 182 refers to a minimum gate-to-source voltage value required to create a conductive path through the transistor (e.g., between a source and drain of a transistor), such as the transistor 94. In other words, when the $V_T$ 182 is applied to a given transistor, electrical current may flow through the transistor to components of the circuit the transistor is included in that are electrically downstream of the transistor. As the $V_{GS}$ 180 of the transistor 94 increases, so does the $V_T$ 182. Likewise, as the $V_{GS}$ 180 of the transistor decreases, so does the $V_T$ 182. As shown in FIG. 11, during the initialization and on-bias stress period 176, the $V_{GS}$ 180 increases, which results in a gradual increase in the $V_T$ 182. Also shown in FIG. 11, the luminance 184 is very low relative to when the LED 92 is emitting light. For instance, the luminance 184 may be zero nits.

Returning back to FIG. 9, the process 150 includes performing a program and threshold voltage sampling process (process block 154). In the program and threshold voltage sampling process, the controller may enable and disable control signals to cause the self-emissive pixel 62G to receive a data transmission (e.g., via DATA terminal 90). Referring now to FIG. 10, the refresh period 172 includes a program and threshold voltage sampling period 178, which corresponds to the program and threshold sampling process (process block 154). As illustrated in FIG. 10, during the program and threshold voltage sampling period 178, the controller 69 may use the driving signal 110, write signal 114, and bypass signal 116 to alter the operation of the self-emissive pixel 62G as illustrated in the portion of FIG. 11 associated with the program and threshold voltage sampling period 178.

For instance, as shown in FIG. 11, the signal from the DATA terminal 90 may flow through the transistor 93 and the transistor 94 to the first node 120. During the program and threshold voltage sampling period 178, the voltage at the first node 120 is equal to the difference between the voltage of the signal from the DATA terminal 90 and the $V_T$ 182 of the transistor 94. Additionally, during the program and threshold voltage sampling period 178, the capacitor 95 coupled to a gate of the transistor 94 may store the image data for a pixel while accounting for a first threshold voltage of the transistor 94.

As also illustrated in FIG. 11, during the program and threshold voltage sampling period 178, the $V_{GS}$ 180 of the transistor 94 may decrease. The $V_T$ 182 may also decrease.

Referring back to FIG. 9, the process 150 may include performing an emission process (process block 156). By performing the emission process, the LED 92 of the self-emissive pixel 62G may emit light based on the signal provided by the DATA terminal 90. For example, referring to the portion of the timing diagram 170 of FIG. 10 associated with the emission period 174, the controller 69 may utilize the emission signal 104 to cause the LED 92 to emit light. Indeed, as illustrated in the portion of FIG. 11 associated with the emission period 174, electric current may flow from the electroluminescence source voltage (ELVDD) 124 through the transistor 96. Additionally, the current may have a voltage greater than the $V_T$ 182 of the transistor 94. Accordingly, the current may flow through the transistor 94. Moreover, because of the emission signal 104, the current may continue to flow through the transistor 96 to cause the LED 92 to emit light. For instance, as illustrated, the luminance 184 increases during the emission period 174.

The voltage of the electrical current provided by the electroluminescence source voltage (ELVDD) 124 may remain constant. However, as also illustrated in FIG. 11, during the emission period 174, the $V_T$ 182 may continue to decrease. In other words, as the $V_T$ 182 decreases, less voltage is needed to traverse transistor 94, which means the voltage provided to the LED 92 may increase over time. In some cases, particularly in cases in which relatively low refresh rates (e.g., ten hertz or lower) are utilized, users of the electronic display 18 utilizing the self-emissive may perceive visual artifacts such as flickering.

Figure 12:
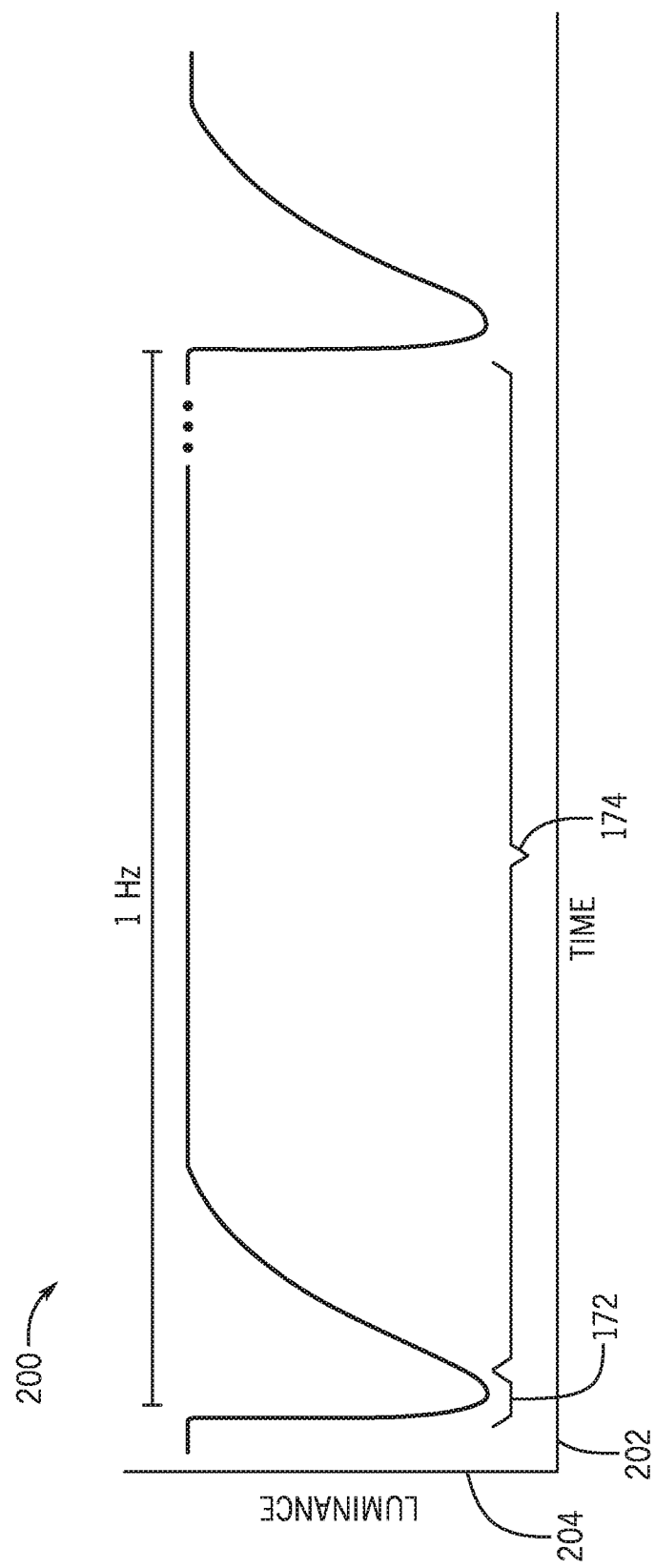
FIG. 12 is a graph of luminance versus time of the self-emissive pixel of FIG. 8 implementing the process of FIG. 9, in accordance with an embodiment.

FIG. 12 is a graph 200 illustrating luminance (axis 202) over time (axis 204) for the electronic display 18 utilizing the self-emissive pixel 62G at a refresh rate of one hertz. As shown, during the refresh period 172, the luminance may decrease substantially as the self-emissive pixel 62G is prepared to emit light based on a different set of data. During the emission period 174, the LED 92 may emit light, and the luminance increases. However, because there is a relatively large amount of time between each time the LED 92 stops emitting light (e.g., during a refresh period 172), the human eye may perceive flickering on the electronic display 18 during the refresh period 172.

Figure 13:
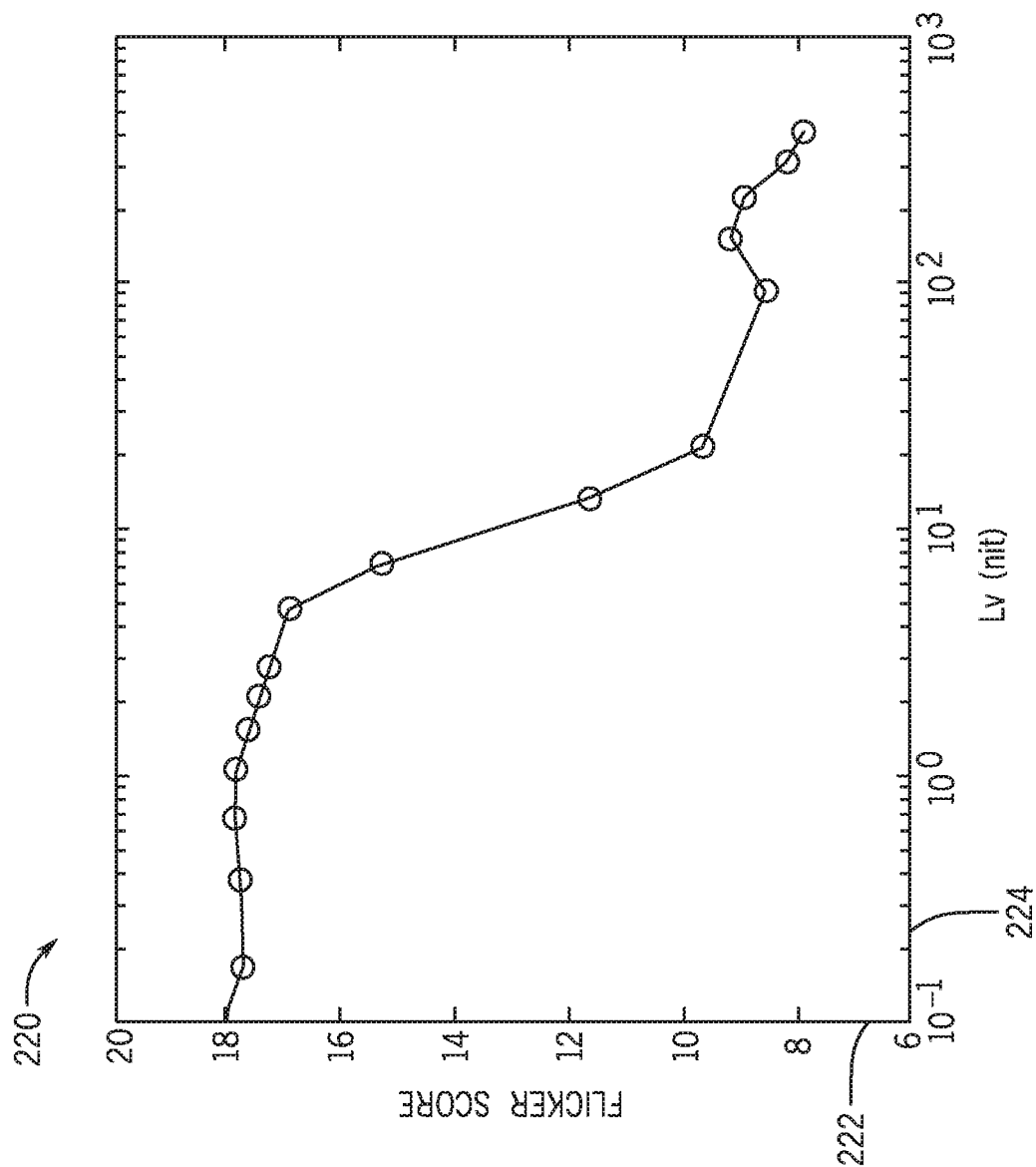
FIG. 13 is a graph illustrating perceptibility of visual artifacts versus luminance for display that includes the self-emissive pixel of FIG. 8, in accordance with an embodiment.

To further illustrate, FIG. 13 is a graph 220 illustrating a perceptibility of visual artifacts (axis 222) versus luminance in nits (axis 224) for the electronic display 18 utilizing the self-emissive pixel 62G at a refresh rate of one hertz. In general, a value along the axis 222 indicates how perceptible visual artifacts may be for a given luminance value. The higher along the axis 222, the more perceptible visual artifacts are. Accordingly, graph 220 indicates that visual artifacts are more visible at lower luminance values. Nevertheless, it should be noted that the graph 220 indicates that visual artifacts may be perceived by the human eye for each luminance value for which there is a data point on the graph 220. In other words, the graph 220 indicates that visual artifacts may be perceived for each level of brightness that the electronic display 18 provides content in.

Continuing with the drawings, FIG. 14 illustrates another embodiment of the self-emissive pixel 62 of FIG. 7. In particular, the self-emissive pixel 62H of FIG. 14 is the self-emissive pixel 62G of FIG. 14 that has been modified to include an additional transistor 126 that may receive a reset signal 128 from the controller 69. As discussed below, the reset signal 128 may be utilized to reduce the amount visual artifacts that are perceptible on a display that utilizes the self-emissive pixel 62H.

FIG. 15 is a flow diagram of a process 228 that the controller 69 may follow in operating the self-emissive pixel 62H. The process 228 includes performing an initialization process (process block 230), performing a program and threshold voltage sampling process (process block 233), performing an emission process (process block 234), performing an anode-reset process (process block 236), and performing an emission process (process block 238).

Figure 16:
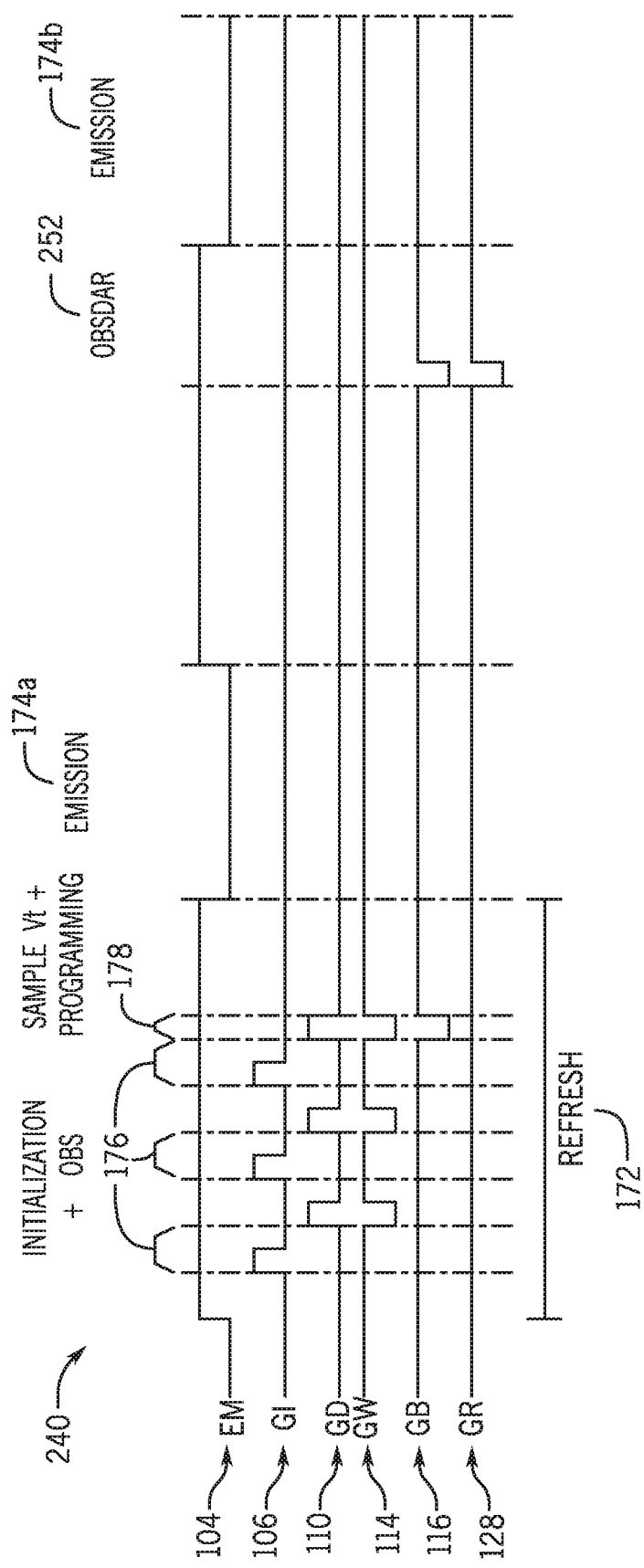
FIG. 16 is a timing diagram of signals transmitted through the self-emissive pixel of FIG. 14 during implementation of the process of FIG. 15, in accordance with an embodiment.

The initialization process (process block 230), program and threshold voltage sampling process (process block 233), and emission process (process blocks 234 and 238) may be implemented in the same manner described above with respect to the self-emissive pixel 62G of FIG. 8. For example, FIG. 16 illustrates a timing diagram 240 that includes the initialization and on-bias stress period 176, program and threshold voltage sampling period 178, and two emission periods 174. As shown in the timing diagram 240, the controller 69 may send the emission signal 104, initialization signal 106, driving signal 110, write signal 114, and bypass signal 116 during the initialization and on-bias stress period 176, program and threshold voltage sampling period 178, and emission periods 174 in the manner described above with respect to the timing diagram 170 of FIG. 10.

The timing diagram also includes an on-bias stress during anode-reset (OBSDAR) period 242 associated with the anode-reset process (process block 236) of the process 228. As also illustrated, the controller 69 may start a second emission period 174*b*, corresponding to the emission process (process block 238), after the OBSDAR period 252. The second emission period 174*b* occurs within one implementation of the process 228. That is, multiple emissions periods 174 are utilized to emit light from the LED 92 of the self-emissive pixel 62 using the same pixel data (e.g., as transmitted from the DATA terminal 90). Hence, whereas a "refresh" refers to emitting light based on new pixel data, a "reset" refers to emitting light based on pixel data for which there has already been an emission period (e.g., during the first emission period 174a).

Figure 17:
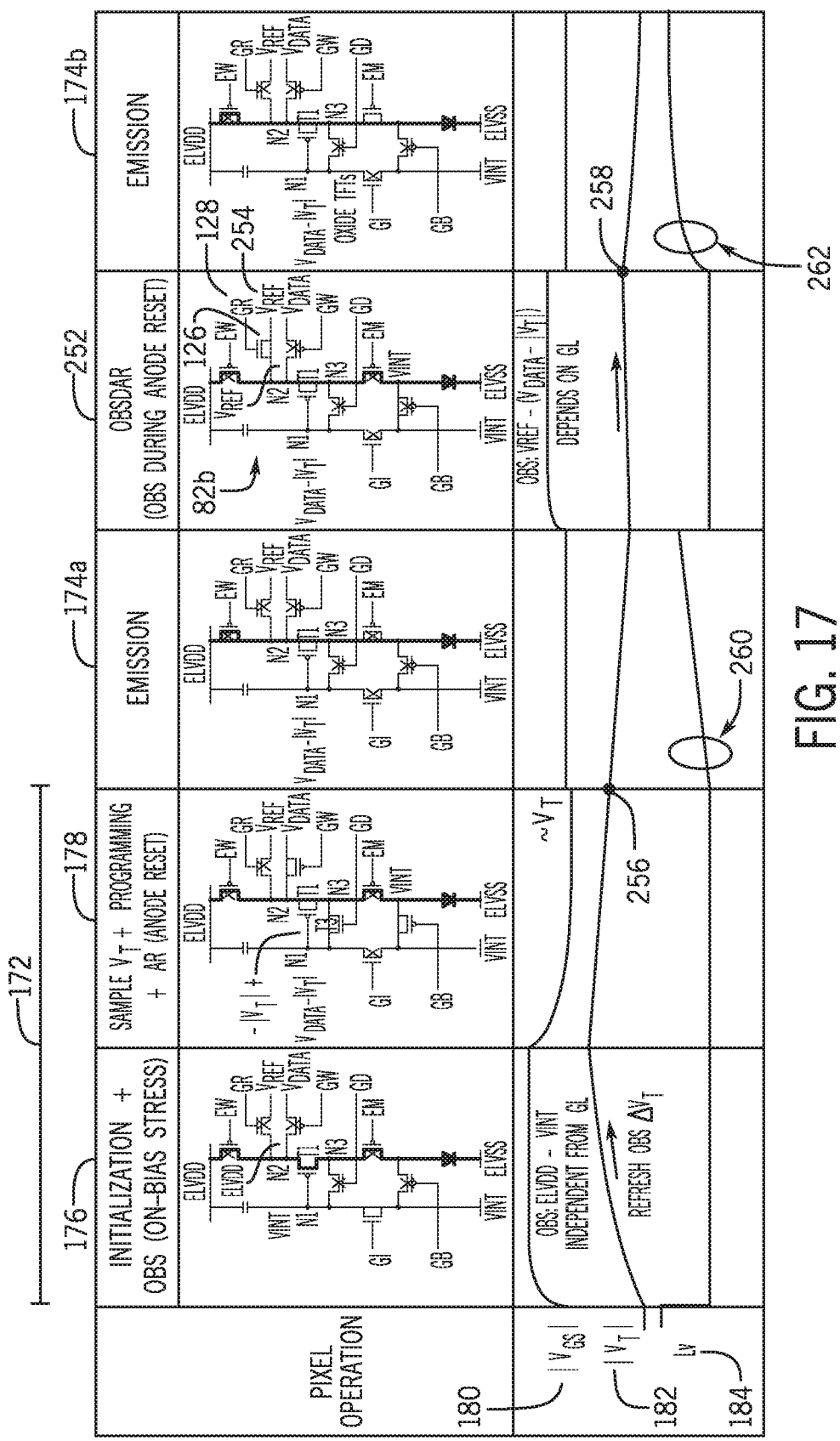
FIG. 17 illustrates circuit diagrams of the self-emissive pixel of FIG. 14 during implementation of the process of FIG. 15, in accordance with an embodiment.

FIG. 17 illustrates the self-emissive pixel 62H during the initialization and on-bias stress period 176, program and threshold voltage sampling period 178, first emission period 174a, OBSDAR period 252, and second emission period 174b. As noted above, the initialization and on-bias stress period 176, program and threshold voltage sampling period 178, and first emissions period 174a may be reached in the same manner described above with respect to the self-emissive pixel 62G of FIG. 8. Accordingly the discussion of self-emissive pixel 62H itself will begin with the OBSDAR period 252.

However, before discussing the functioning of the self-emissive pixel 62H during the OBSDAR period 252, it should also be noted that FIG. 17 also illustrates the absolute value of the $V_{GS}$ 180 of the transistor 94, the absolute value of the $V_T$ 182 of the transistor 94, and the luminance 184 as a function of time. In particular, a first threshold voltage 256 is present when the first emission period 174a commences. As discussed above, the $V_T$ 182 may decrease over time after the initialization period and on-bias stress period 176 ends. As discussed below, the anode-reset process (process block 236) may be performed in order to increase the $V_T$ 182 so that at the beginning of the second emission period 174b a second threshold voltage 258 similar to the first threshold voltage 256 is achieved.

During the OBSDAR period 252, which corresponds to the anode-reset process (process block 236) of FIG. 15, the controller 69 may send the reset signal 128 to the transistor 126 to enable a reference voltage ($V_{REF}$) 254 to be transmitted to the transistor 94. The controller 69 may control the voltage of the reference voltage 254 based on a grey level associated with the pixel data indicated the voltage of the signal provided by the DATA terminal 90. In other words, the signal provided by the DATA terminal 90 may be indicative of a grayscale definition of the light to be emitted by the LED 92, and the controller 69 may provide a reference voltage 254 of varying voltages based on the grayscale definition of the light to be emitted by the LED 92. For instance, the local memory 14 or main memory storage device 16 may include a look-up table that defines the value of the reference voltage 254 for values of the for a particular voltage values of the signal provided by the DATA terminal 90, and the controller 69 may utilize the look-up table to determine and provide the reference voltage 254.

As shown in FIG. 17, during the OBSDAR period 252, the absolute value of the $V_{GS}$ 180 increases, which also causes the $V_T$ 182 to increase. Thus, when the controller 69 commences the second emission period 174b, the second threshold voltage 258 occurs. It should be noted if the $V_T$ 182 were not increased and the second emission period 174b were to be commenced, a second threshold voltage lower than the second threshold voltage 258 of FIG. 17 would be obtained. As explained below with respect to FIG. 18 and FIG. 19, the human eye is less able to perceive visual artifacts the closer in value the first threshold voltage 256 and the second threshold voltage 258 are to one another. In particular, a first luminance function 260 may describe the first emission period 174a, and a second luminance function 262 may describe the second emission period 174b, which may result in the difference between the first threshold voltage 256 and second threshold voltage 258. However, before proceeding to discuss FIG. 18, it should be noted that while FIG. 17 only illustrates a single second emission period 174b, in other embodiments, the controller 69 may implement several second emission periods. In other words, the controller 69 may perform several resets before entering another initialization and on-bias stress period 176.

Figure 18:
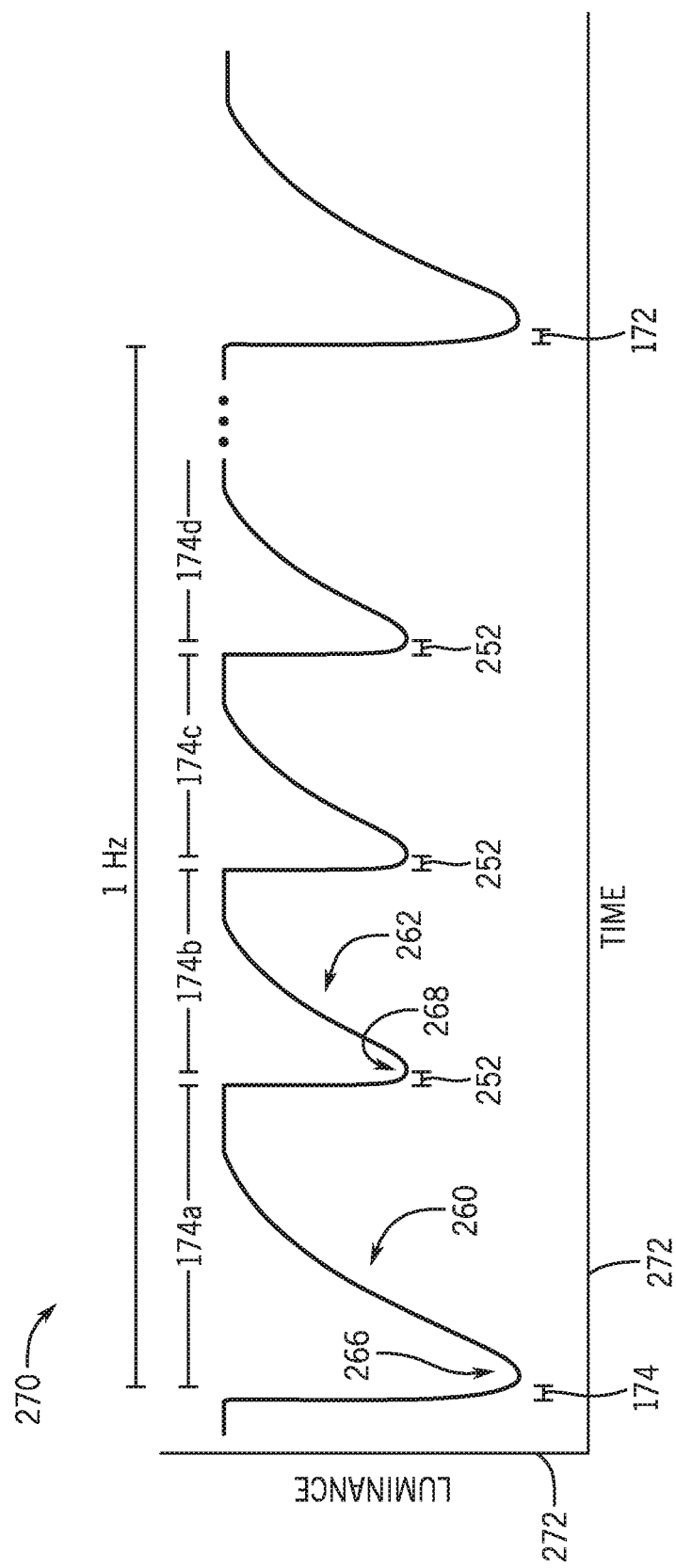
FIG. 18 is a graph of luminance versus time of the self-emissive pixel of FIG. 14 implementing the process of FIG. 15, in accordance with an embodiment.

FIG. 18 is a graph 270 illustrating luminance (axis 272) over time (axis 274) for the electronic display 18 utilizing the self-emissive pixel 62H at a refresh rate of one hertz. As shown, during the refresh period 172, the luminance may decrease to a first luminance 266 as the self-emissive pixel 62H is prepared to emit light based on a different set of data. During the first emission period 174a, the LED 92 may emit light, and the luminance increases. The controller 69 may initiate an anode-reset during the OBSDAR period 252, which may cause the luminance to decrease to a second luminance 268 before initiating the second emission period 174b. As illustrated, the controller 69 may also perform additional anode-resets (indicated by OBSDAR periods 242) and subsequent emission periods 174c, 174d before another refresh period 172 occurs.

Figure 19:
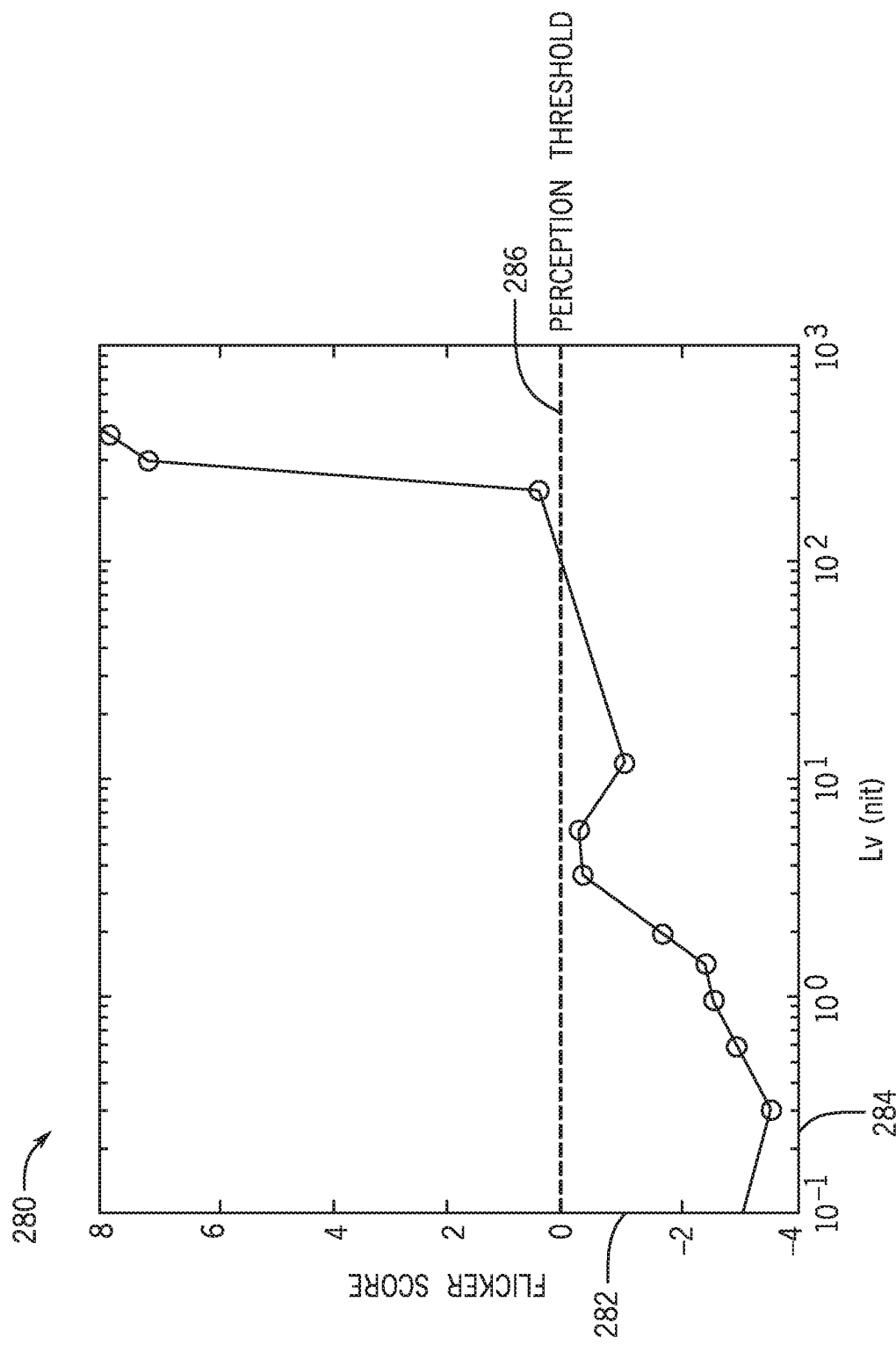
FIG. 19 is a graph illustrating perceptibility of visual artifacts versus luminance for display that includes the self-emissive pixel of FIG. 14, in accordance with an embodiment.

As shown in the graph 270, the first luminance function 260 (e.g., waveform) associated with the first emission period 174a differs from the second luminance function 262 associated with the second emission period 174b. Additionally, the first luminance 266 and second luminance 268 differ, which is indicative of the first luminance function 260 and second luminance function 262 differing from one another as well as the first threshold voltage 256 and second threshold voltage 258 differing from one another. Due to this difference between the first luminance function 260 and second luminance function 262, visual artifacts may be perceivable at certain luminance values. In particular, while visual artifacts may no longer be caused due to the relatively large refresh rate, the second luminance 268 not returning to the first luminance 266 during the OBSDAR periods 242 may be perceivable to the human eye in the form of visual artifacts, such as flickering on the electronic display 18. For instance, FIG. 19 is a graph 280 of the perceptibility of visual artifacts (axis 282) versus luminance (axis 284) for a display, such as the electronic display 18, operating at a refresh rate of one hertz and utilizing the self-emissive pixel 62H. The graph 280 also includes a line 286; data points below the line 286 are indicative of luminance values at which the human eye is unable to perceive visual artifacts, and data points above the line 286 are indicative of luminance values at which the human eye is able to perceive visual artifacts. As shown in the graph 280, luminance values lower than approximately 100 nits are located underneath the line 286. Accordingly, by implementing the process 228 with the self-emissive pixel 62H, visual artifacts are imperceptible to the human eye when the electronic display 18 that includes the self-emissive pixels 62b has a luminance of 100 nits or less. However, as indicated by the graph 280, at luminance values greater than approximately 100 nits, visual artifacts may be perceived by human eyes. Thus, by implementing the process 228 of utilizing the self-emissive pixel 62H, visual artifacts associated with the first luminance function 260 and second luminance function 262 differing from one another as well as the first threshold voltage 256 and second threshold voltage 258 differing from one another may be mitigated for some luminance values in displays operating with relatively low refresh rates (e.g., 10 hertz or less). However, the first threshold voltage 256 and second threshold voltage 258 being different from one another, which can be caused by different waveforms (e.g., the first luminance function 160 and second luminance function 162) existing for the luminance during first emission period 174a and the second emission period 174b, may result in visual artifacts that are perceivable to the human eye at other luminance values.

Continuing with the drawings, FIG. 20 illustrates another embodiment of the self-emissive pixel 62 of FIG. 7. In particular, FIG. 20 illustrates a self-emissive pixel 62I for which the first luminance function 260 and second luminance function 262 may be equal. As illustrated, the self-emissive pixel 62I is similar to the self-emissive pixel 62H of FIG. 14. However, the placement of the bypass transistor 118 is different, as is the control signal associated with the bypass transistor 118. For instance, rather than receive the initialization signal 106, the controller 69 may cause the bypass signal 116 to be sent to the bypass transistor 118 of the self-emissive pixel 62I. Furthermore, before proceeding to discuss FIG. 19, it should be noted that, in other embodiments, different control signals may be associated with the bypass transistor 118. For instance, in some embodiments, the write signal 114 may be sent to the bypass transistor 118, while in other embodiments, the reset signal 128 may be sent to the bypass transistor 118. Additionally, the capacitor 95 may store image data for the self-emissive pixel 62I while accounting for a threshold voltage of the transistor 94.

FIG. 21 is a flow diagram of a process 300 that the controller 69 may perform in operating the self-emissive pixel 62I. The process 300 includes performing an initialization process (process block 302), performing a program and threshold voltage sampling process (process block 304), performing an on-bias stress process (process block 306), performing an emission process (process block 308), performing an anode-reset process (process block 310), performing an on-bias stress process (process block 312) and performing an emission process (process block 314). As described below, several portions of the process 300 may correspond to portions of the process 228. However, as also described below, by performing an on-bias stress process after a program and threshold voltage sample process as well as by performing an anode-reset process and on-bias stress process between emissions, the first luminance function 260 and second luminance function 262 may be equivalent, which renders visual artifacts unperceivable to the human eye.

Figure 22:
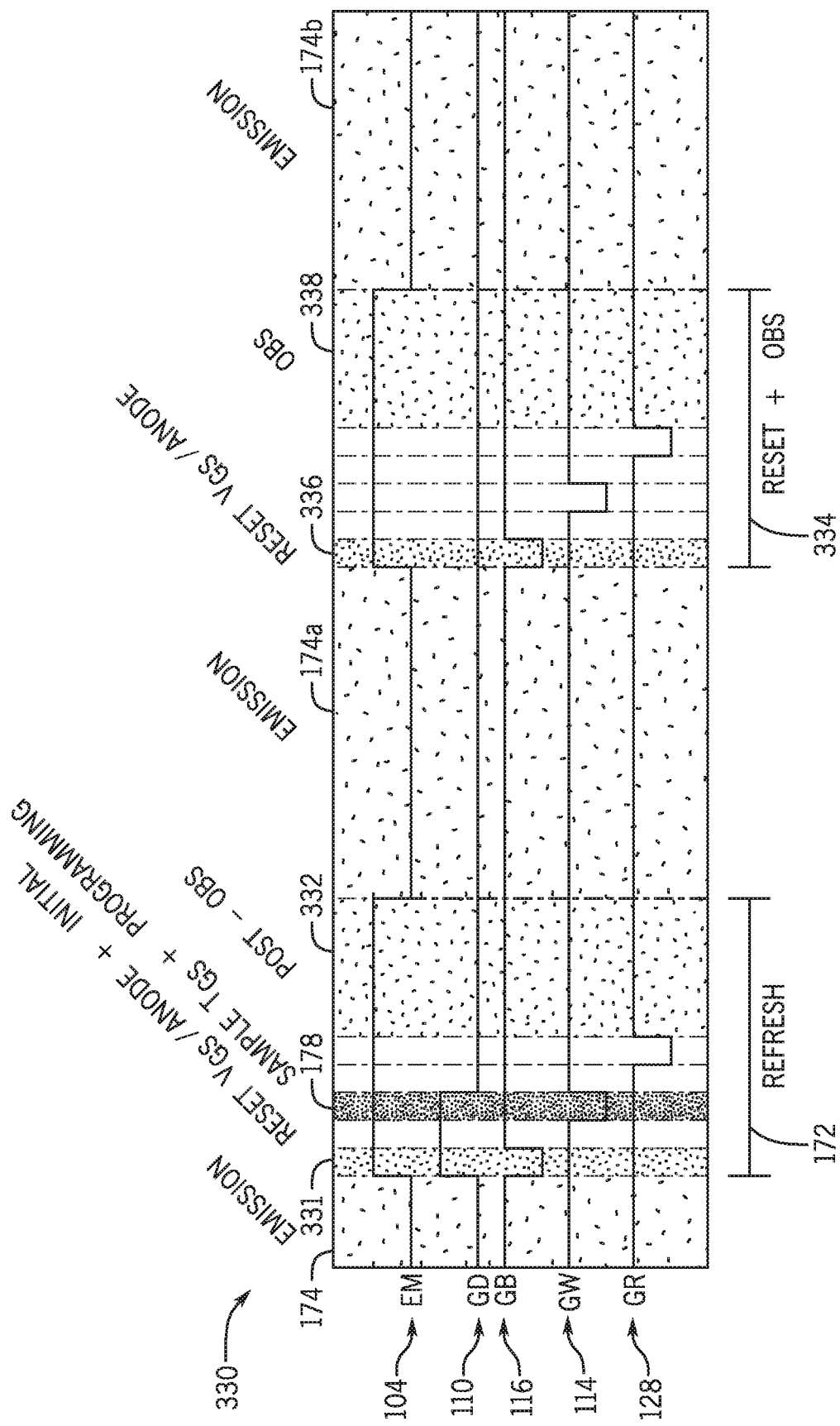
FIG. 22 is a timing diagram of signals transmitted through the self-emissive pixel of FIG. 20 during implementation of the process of FIG. 21, in accordance with an embodiment.

Bearing this in mind, FIG. 22 is a timing diagram 330 that illustrates how the controller 69 applies various control signals during performance of the process 300.

Figure 23A:
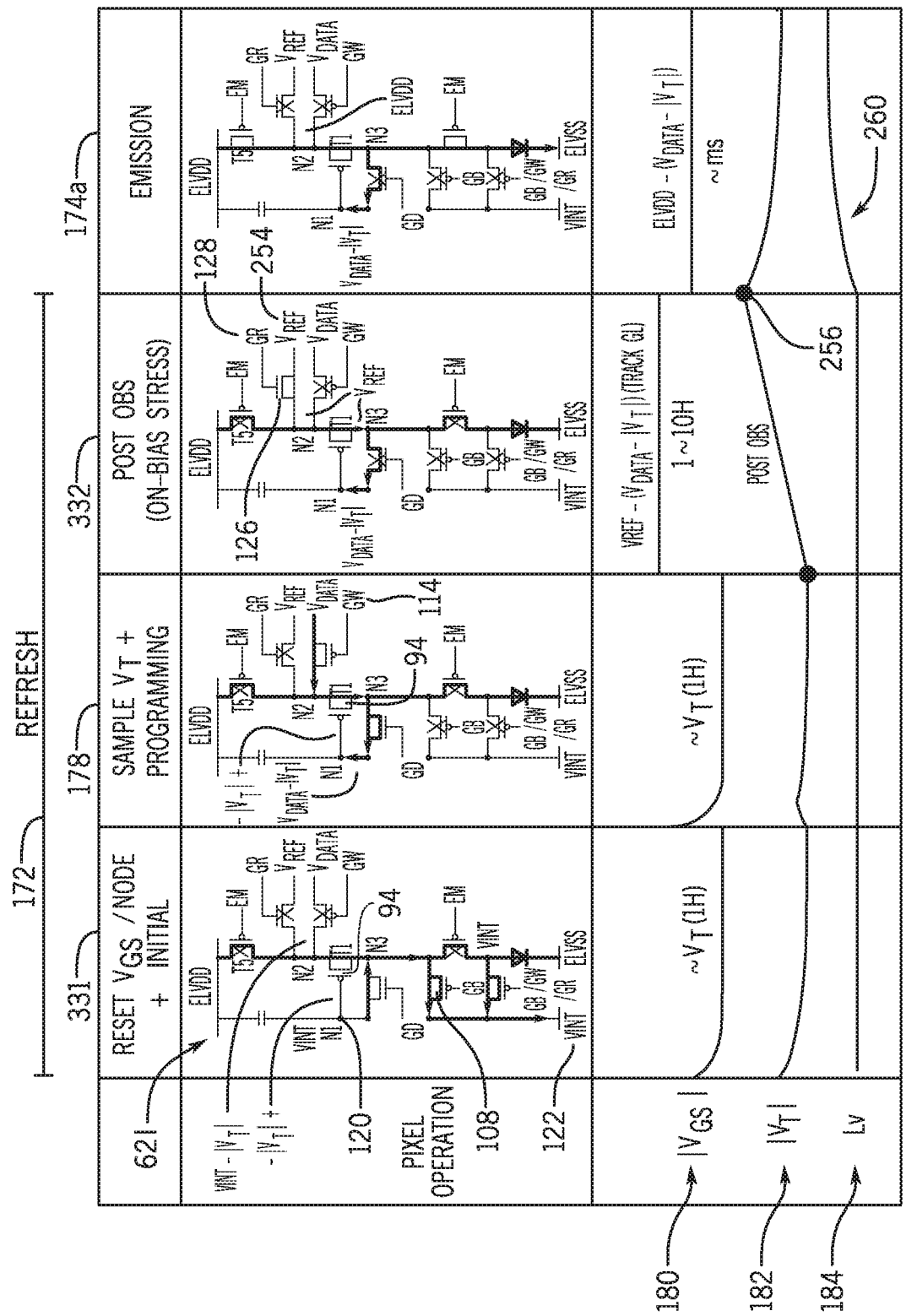
FIG. 23A and FIG. 23B illustrate circuit diagrams of the self-emissive pixel of FIG. 20 during implementation of the process of FIG. 21, in accordance with an embodiment.
Figure 23B:
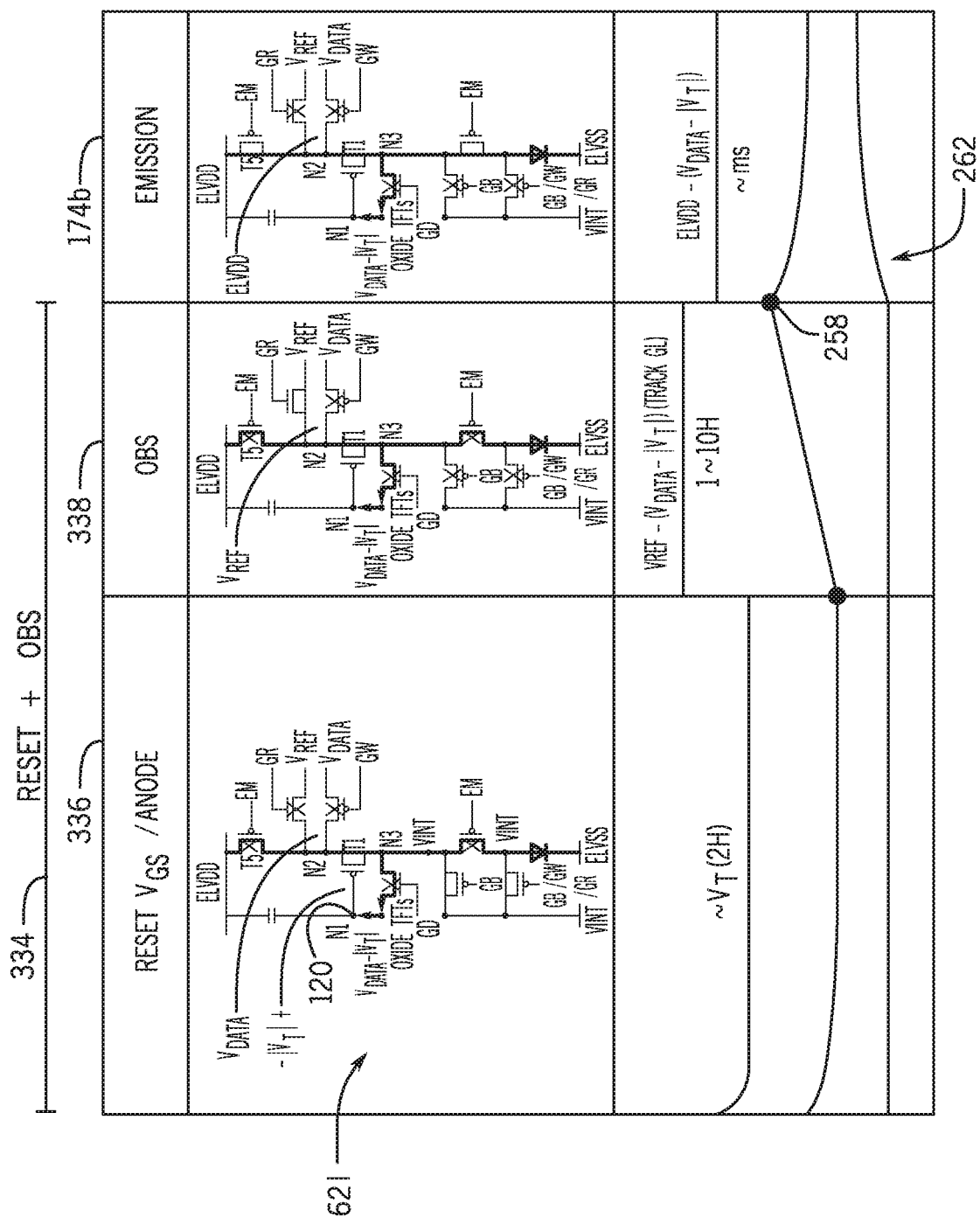

During the initialization process (process block 302), which corresponds to an initialization and anode-reset period 331 of the timing diagram 330, the controller 69 may cause the self-emissive pixel 62I to stop emitting light via the LED 92 by changing the emission signal 104. Additionally, the controller 69 may provide the driving signal 110 and bypass signal 116. FIG. 23A and FIG. 23B illustrate diagrams of the self-emissive pixel 62I while the controller 69 performs the process 300. As shown in FIG. 23A, during the initialization and anode-reset period 331, current may flow through the transistor 94 and the transistor 108 to the source of the VINT 122, which may help to clear residual signals from the self-emissive pixel 62I.

Referring back to FIG. 21, the process 300 includes performing a program and threshold voltage sampling process (process block 304), which is represented by the program and threshold voltage sampling period 178 of FIG. 22. During the program and threshold voltage sampling period 178, the controller 69 may cause the write signal 114 to be sent, which, as shown in FIG. 23A, enables the signal from the DATA terminal 90 to traverse the transistor 94. During the program and threshold voltage sampling period 178, the voltage at the first node 120 and the capacitor 95 may be equal to the $V_{GS}$ 180, which is equal to the difference of the voltage of the signal from the DATA terminal 90 and the $V_T$ 182 of the transistor 94.

Continuing with the discussion of the process 300 of FIG. 21, the controller 69 may perform an on-bias stress process (process block 206), which may also be referred to as a "post-OBS process." To perform the post-OBS process, the controller 69 may act in accordance with the control signals indicated during a post-OBS period 332 of the timing diagram 330 of FIG. 22. For instance, a reset signal 128 may be transmitted, as shown in FIG. 23A, to enable the $V_{REF}$ 254, which may be specific to a particular gray value associated with pixel data from the DATA terminal 90, to be applied to the transistor 94. As further illustrated in FIG. 23A, during the post-OBS period 332, the absolute value of the $V_{GS}$ 180 may increase, which also causes the $V_T$ 182 to increase to the first threshold voltage 256. Furthermore, during the post-OBS period 332, the $V_{GS}$ 180 may be equal to $V_{REF}$ 254 minus a difference of the voltage of the signal from the DATA terminal 90 and the absolute value of the $V_T$ 182 of the transistor 94.

Referring back to FIG. 21, the process 300 includes performing an emission process (process block 308). The emission process is represented by the first emission period 174a of FIG. 22 as well as the corresponding portion of FIG. 23A. During the first emission period 174a, the $V_{GS}$ 180 of the transistor 94 is equal to the electroluminescence source voltage (ELVDD) 124 minus the voltage of the signal from the DATA terminal 90 and the absolute value of the $V_T$ 182 of the transistor 94. As shown in FIG. 23A, the $V_{GS}$ 180 and $V_T$ 182 of the transistor 94 may decrease. Additionally, light may be emitted from the LED 92 in accordance with the first luminance function 260.

The controller 69 may perform the anode-reset process (process block 310) and on-bias stress process (process block 312) during a reset and on-bias stress period 334 of the timing diagram 330. In particular, the reset and on-bias stress period 334 includes an anode-reset period 336 and an on-bias stress period 338, which respectively correspond to when the anode-reset process and on-bias stress process are performed by the controller 69. As illustrated in the timing diagram 330, the controller 69 may utilize the same timing of the control signals as the initialization process (indicated by the initialization and anode-reset period 331) with the exception that the driving signal 110 is not utilized (e.g., to maintain a voltage at the first node 120 that is equal to the difference of the voltage of the signal from the DATA terminal 90 and the absolute value of the $V_T$ 182 of the transistor 94). Moreover, during the on-bias stress period 338, the controller 69 may send the same control signals as during the post-OBS period 332.

Referring now to FIG. 23B, during the on-bias stress period 338, the $V_T$ 182 may increase to the second threshold voltage 258, which is equal to the first threshold voltage 256. Moreover, when the controller initiates the second emission period 174b, which corresponds to performance of the emission process (process block 314) of the process 300, the second luminance function 262 is observed to be equivalent to the first luminance function 260.

Figure 24:
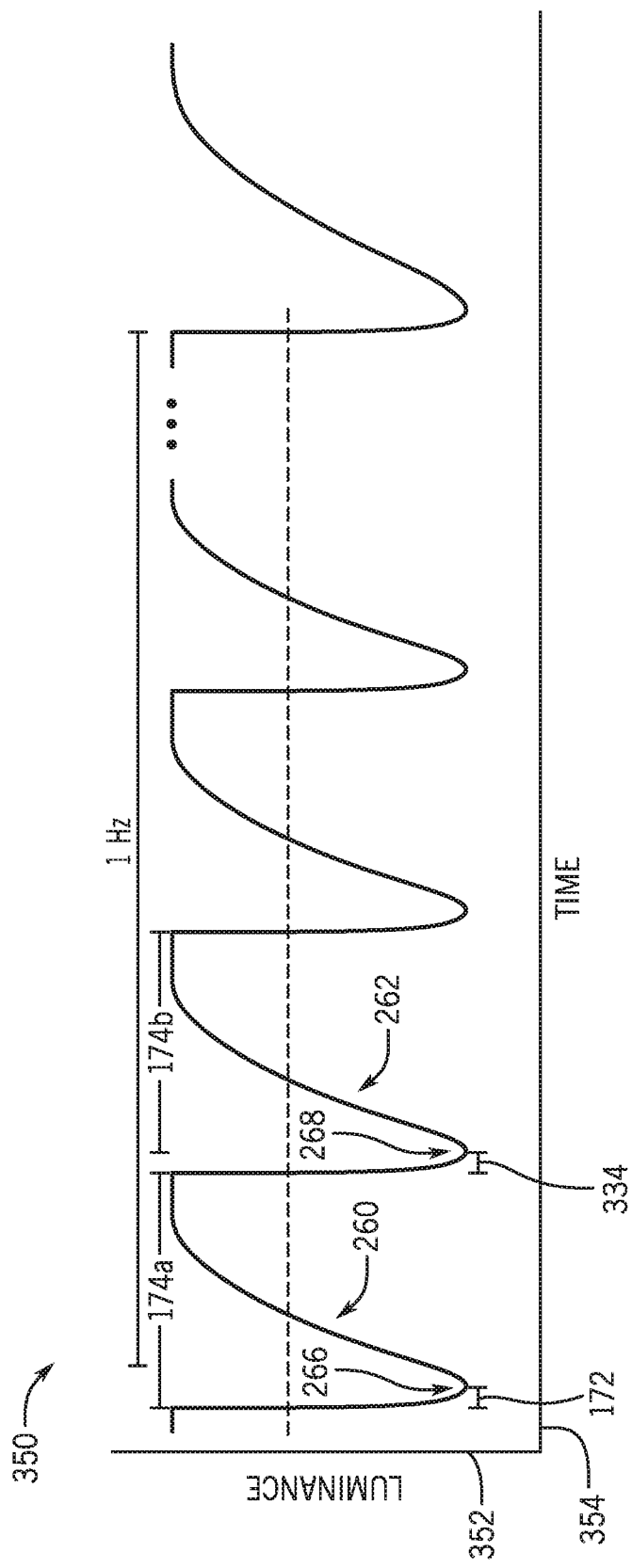
FIG. 24 is a graph of luminance versus time of the self-emissive pixel of FIG. 20 implementing the process of FIG. 21, in accordance with an embodiment.

FIG. 24 is a graph 350 illustrating luminance (axis 352) over time (axis 354) for a display, such as the electronic display 18, performing the process 300 and utilizing the self-emissive pixel 62I at a refresh rate of one hertz. During the refresh period 172, the luminance may decrease to the first luminance 266 as the self-emissive pixel 62I is prepared to emit light based on a different set of data. During the first emission period 174a, the luminance increases in the shape of the illustrated waveform (e.g., the first luminance function 260). The controller 69 may initiate the anode-reset process and on-bias stress process during the reset and on-bias stress period 334, at which time the luminance decreases to the second luminance 268, which is substantially equal to the first luminance 266. Moreover, during the second emission period 174b, the luminance follows the second luminance function 262, which is substantially equivalent to the first luminance function 260.

Figure 25:
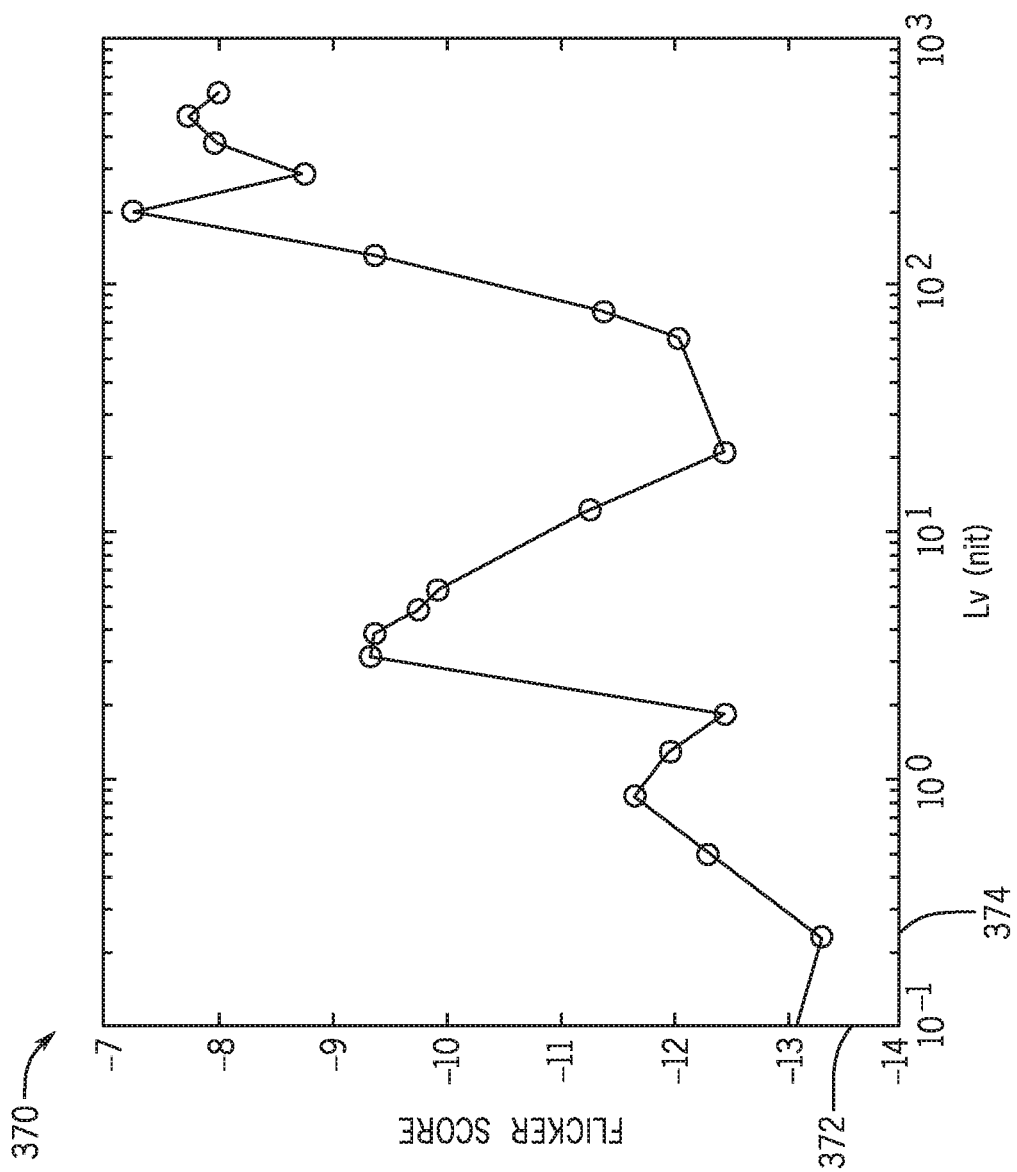
FIG. 25 is a graph illustrating perceptibility of visual artifacts versus luminance for display that includes the self-emissive pixel of FIG. 20, in accordance with an embodiment.

Because the first luminance function 260 and the second luminance function 262 are the same or very similar, the human eye cannot perceive visual artifacts associated with the "resets" (e.g., anode-reset process and on-bias stress process performed during the reset and on-bias stress period 334). For instance, FIG. 25 is a graph 370 illustrating the perceptibility of visual artifacts (axis 372) versus luminance (axis 374) for a display, such as the electronic display 18, operating at a refresh rate of 1 hertz utilizing and the self-emissive pixel 62I in accordance with the process 300. Regarding the axis 372, negative values refer to visual artifacts that are not visible to the human eye. Because the data points of the graph 370 associated with a range of luminance values each correspond to negative values of the axis 372, no visual artifacts are visible at any of the luminance values at which content may be presented on the electronic display 18 that is utilizing the self-emissive pixel 62I in accordance with the process 300. As such, performing an on-bias stress process (e.g., the post-OBS process) after a program and threshold voltage sampling process as well as performing an anode-reset process and on-bias stress process between a first emission period and a second emission period, visual artifacts on a display, such as the electronic display 18, may be imperceptible to the human eye for any luminance value the electronic display 18 is capable of operating at even when the electronic display 18 is operating with a low refresh rate, such as a refresh rate of ten hertz or less than ten hertz.

Figure 26:
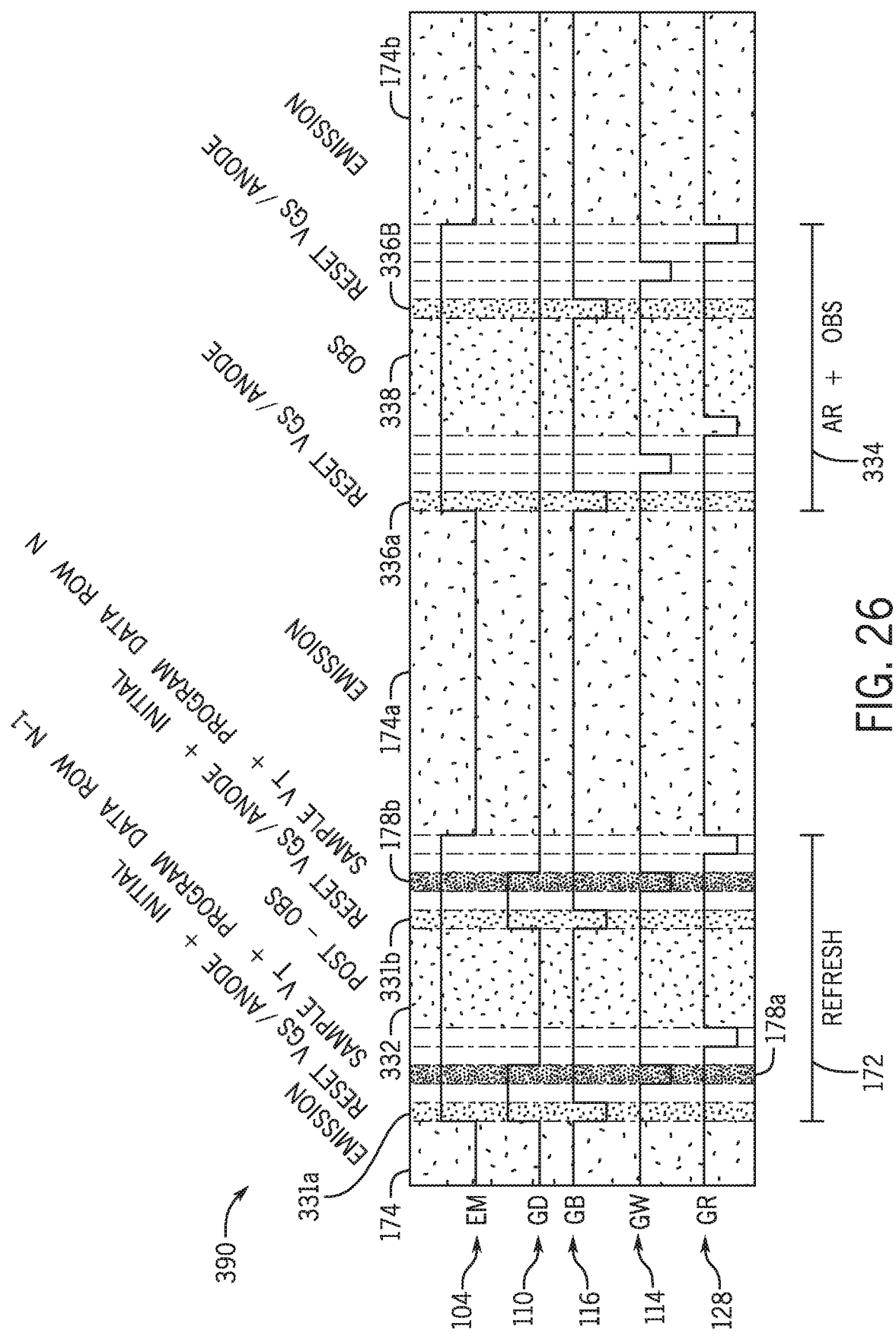
FIG. 26 is a timing diagram of signals transmitted through the self-emissive pixel of FIG. 8 during the implementation of the process of FIG. 21, in accordance with an embodiment.

In other embodiments of the process 300, the controller 69 may perform the initialization process (process block 302) program and threshold voltage sampling process (process block 304) after performing the OBS process (process block 306). For example, FIG. 26 illustrates a timing diagram 390 of control signals sent by the controller 69 during implementation of such an embodiment of the process 300. As illustrated, the initialization process may be performed during a first initialization and anode reset period 331a, the program and threshold voltage sampling process may be performed during a first programming and sampling period 178a, and the post-OBS process may be performed during the post-OBS period 332. As additionally illustrated, before the first emission period 174a, the controller 69 may perform the initialization process (process block 302) program and threshold voltage sampling process (process block 304) again (e.g., during a second initialization and anode reset period 331b and a second programming and sampling period 178a, respectively). Moreover, during the on-bias stress period 334, the controller 69 may perform the anode-reset process (process block 310) a second time (e.g., during a second anode-reset period 336b) before performing the emission process to enter the second emission period 174b. Performing the initialization process (process block 302) program, threshold voltage sampling process (process block 304), and anode-reset process (process block 310) a second time may enable the controller 69 to provide more accurate signals when controlling the self-emissive pixel 62I. Furthermore, while each of the initialization process (process block 302) program, threshold voltage sampling process (process block 304), and anode-reset process (process block 310) are shown as being performed twice in FIG. 26, in other embodiments, these processes may be performed more than twice (e.g., three, four, five, or more times).

In some embodiments, the controller 69 may selectively determine whether to operate the self-emissive pixel 62I in accordance with the process 300. For example, based on the image data to be displayed, the controller 69 may determine a refresh rate at which the content associated with the image data should be shown on the electronic display 18. For instance, for content with a relatively high amount of image data, such as video content, the controller 69 may cause the self-emissive pixel 62I to operate according to a technique different than the process 300. However, for other content, such as content with relatively little image data (e.g., still images, text), the controller 69 may determine that the electronic display 18 should operate with a relatively low refresh rate (e.g., a low refresh rate mode), such as a refresh rate of ten hertz or lower, in which case the controller 69 may control the self-emissive pixel 62I in accordance with the process 300.

Figure 27:
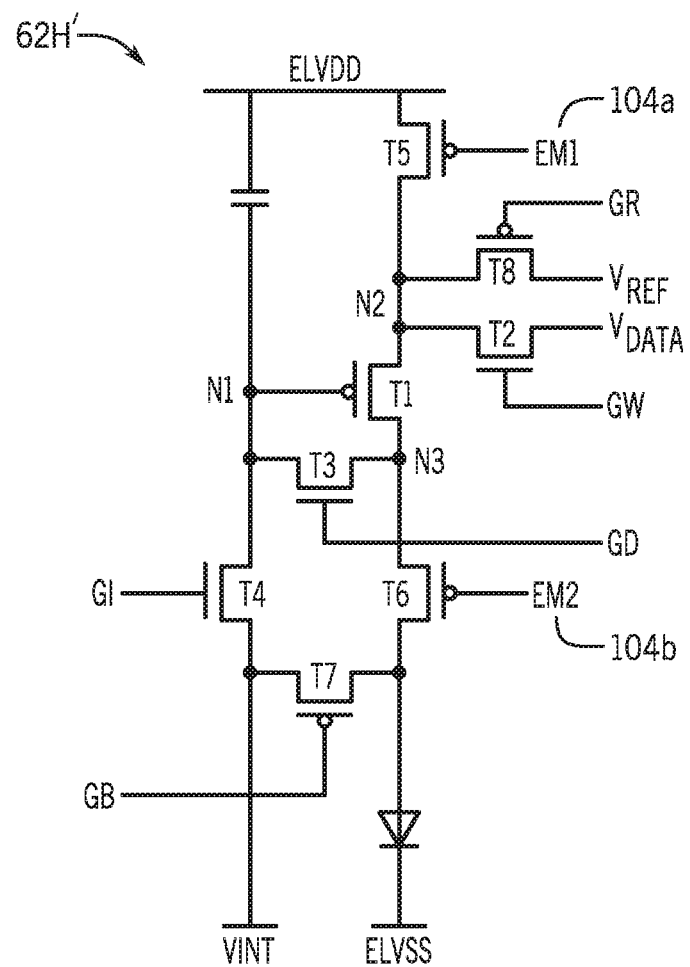
FIG. 27 is a circuit diagram of a self-emissive pixel of the display of FIG. 7, in accordance with an embodiment.

FIGS. 25-36 illustrate embodiments of the self-emissive pixel 62 and corresponding timing diagrams for the embodiments of the self-emissive pixel 62. Each of these embodiments may be utilized, in accordance with the corresponding timing diagram, to eliminate the occurrence of perceptible visual artifacts on displays operating at low refresh rates. With this in mind, FIG. 27 illustrates a circuit diagram of a self-emissive pixel 62H', which is the same as the self-emissive pixel 62H of FIG. 14 with the exception that the self-emissive pixel 62H' is configured to receive two emission signals 104 (e.g., a first emission signal 104a and second emission signal 104b).

Figure 28:
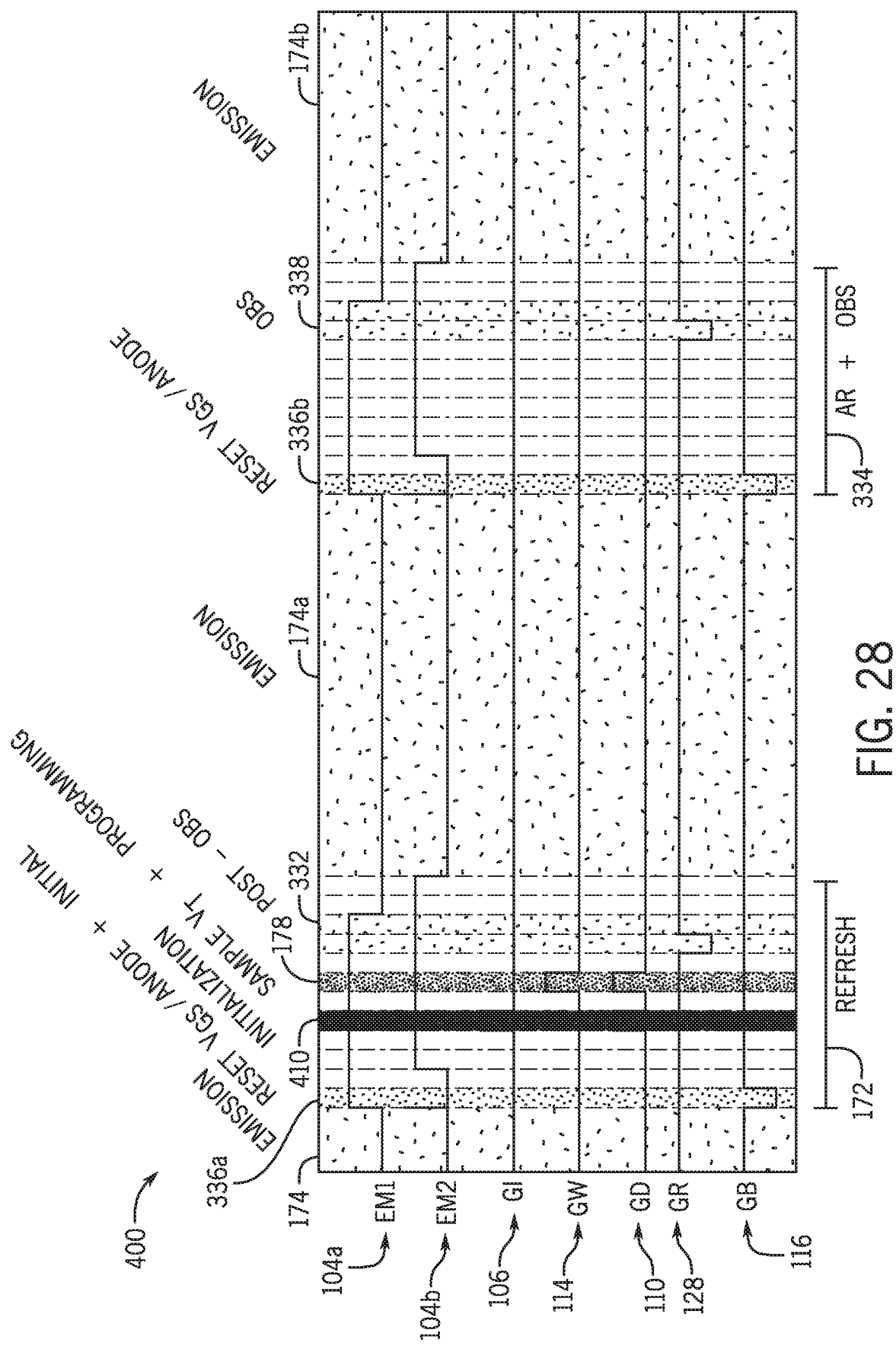
FIG. 28 is a timing diagram of signals transmitted through the self-emissive pixel of FIG. 27, in accordance with an embodiment.

FIG. 28 illustrates a timing diagram 400 that describes the timing of control signals provided by the controller 69 to control the self-emissive pixel 62H'. The timing diagram 400 includes a first anode-reset period 336a, an initialization period 402, a program and threshold voltage sampling period 178, post-OBS period 332, a first emission period 174a, a second anode-reset period 336b, an on-bias stress period 338, and a second emission period 174b.

Figure 29:
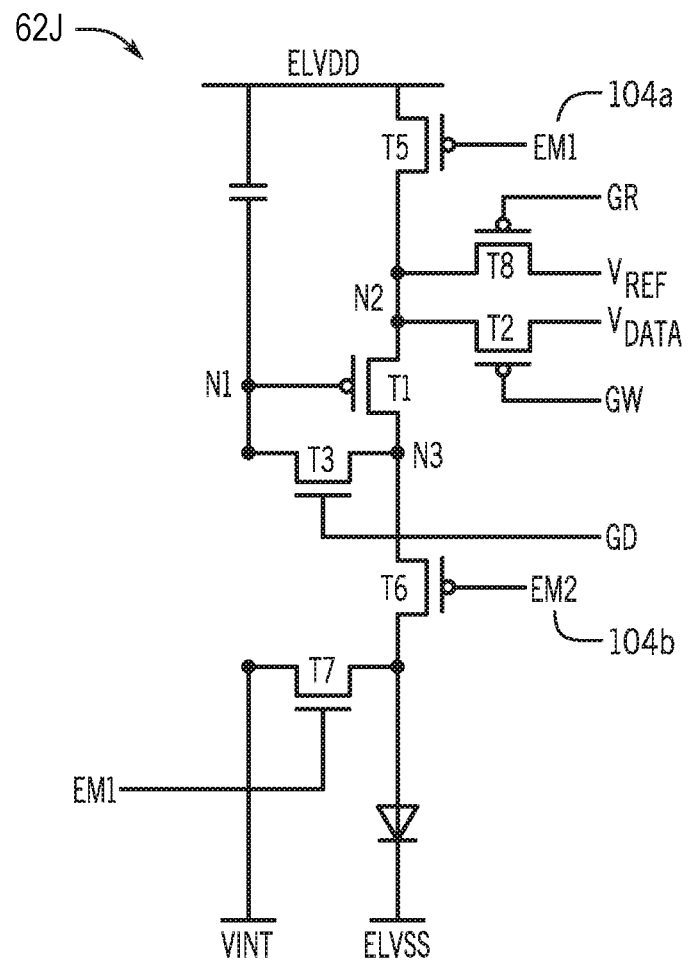
FIG. 29 is a circuit diagram of a self-emissive pixel of the display of FIG. 7, in accordance with an embodiment.

FIG. 29 illustrates a circuit diagram of a self-emissive pixel 62J. The self-emissive pixel 62J is generally similar to the self-emissive pixel 62I. However, the self-emissive pixel 62J does not include the transistor 108 or receive the bypass signal 116 like the self-emissive pixel 62I. Moreover, the self-emissive pixel 62J receives two different emission signals 104 (e.g., emission signal 104a and emission signal 104b) from the controller 69.

Figure 30:
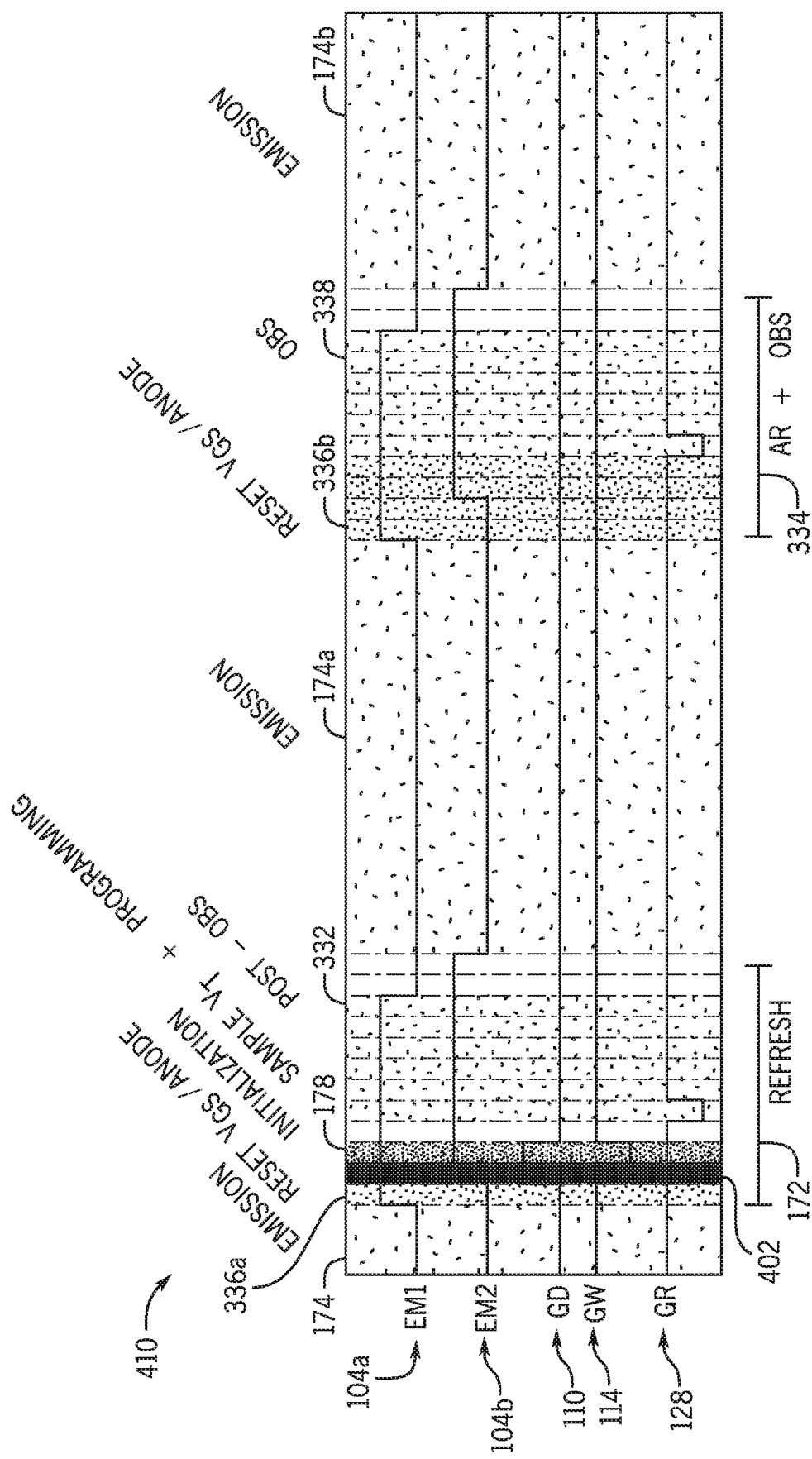
FIG. 30 is a timing diagram of signals transmitted through the self-emissive pixel of FIG. 29, in accordance with an embodiment.

FIG. 30 illustrates a timing diagram 410 that describes the timing of control signals provided by the controller 69 to control the self-emissive pixel 62J. The timing diagram 410 includes a first anode-reset period 336a, an initialization period 402, a program and threshold voltage sampling period 178, post-OBS period 332, a first emission period 174a, a second anode-reset period 336b, an on-bias stress period 338, and a second emission period 174b.

Figure 31:
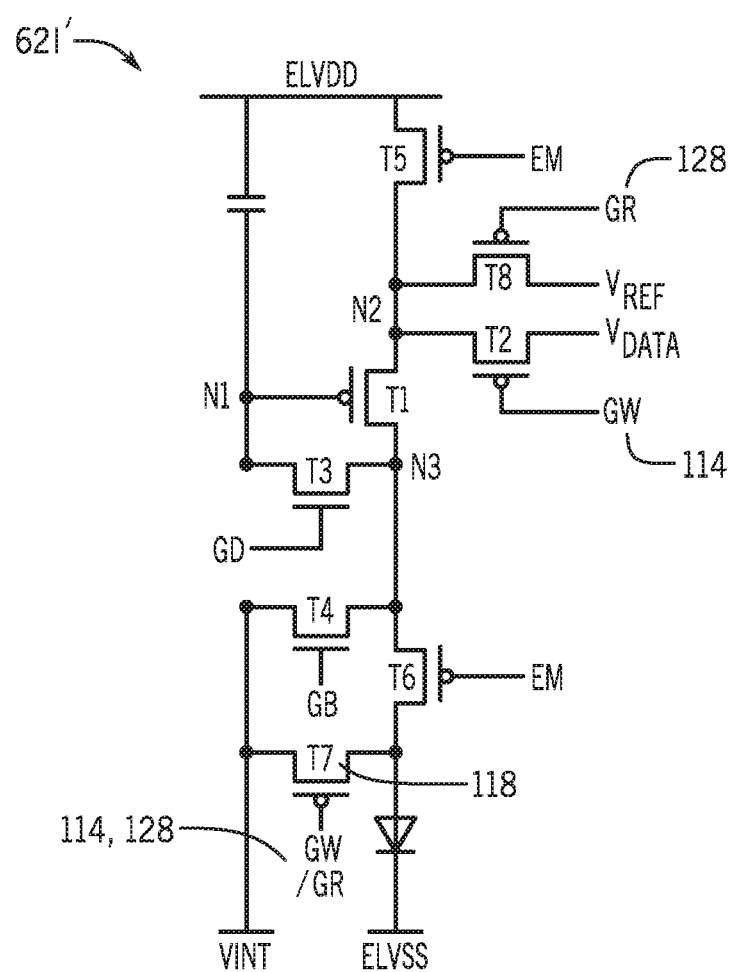
FIG. 31 is a circuit diagram of a self-emissive pixel of the display of FIG. 7, in accordance with an embodiment.

FIG. 31 illustrates a circuit diagram of a self-emissive pixel 62I', which is the same as the self-emissive pixel 62I except that the bypass transistor 118 of self-emissive pixel 62I' receives the write signal 114 or reset signal 128 rather than the bypass signal 116.

Figure 32:
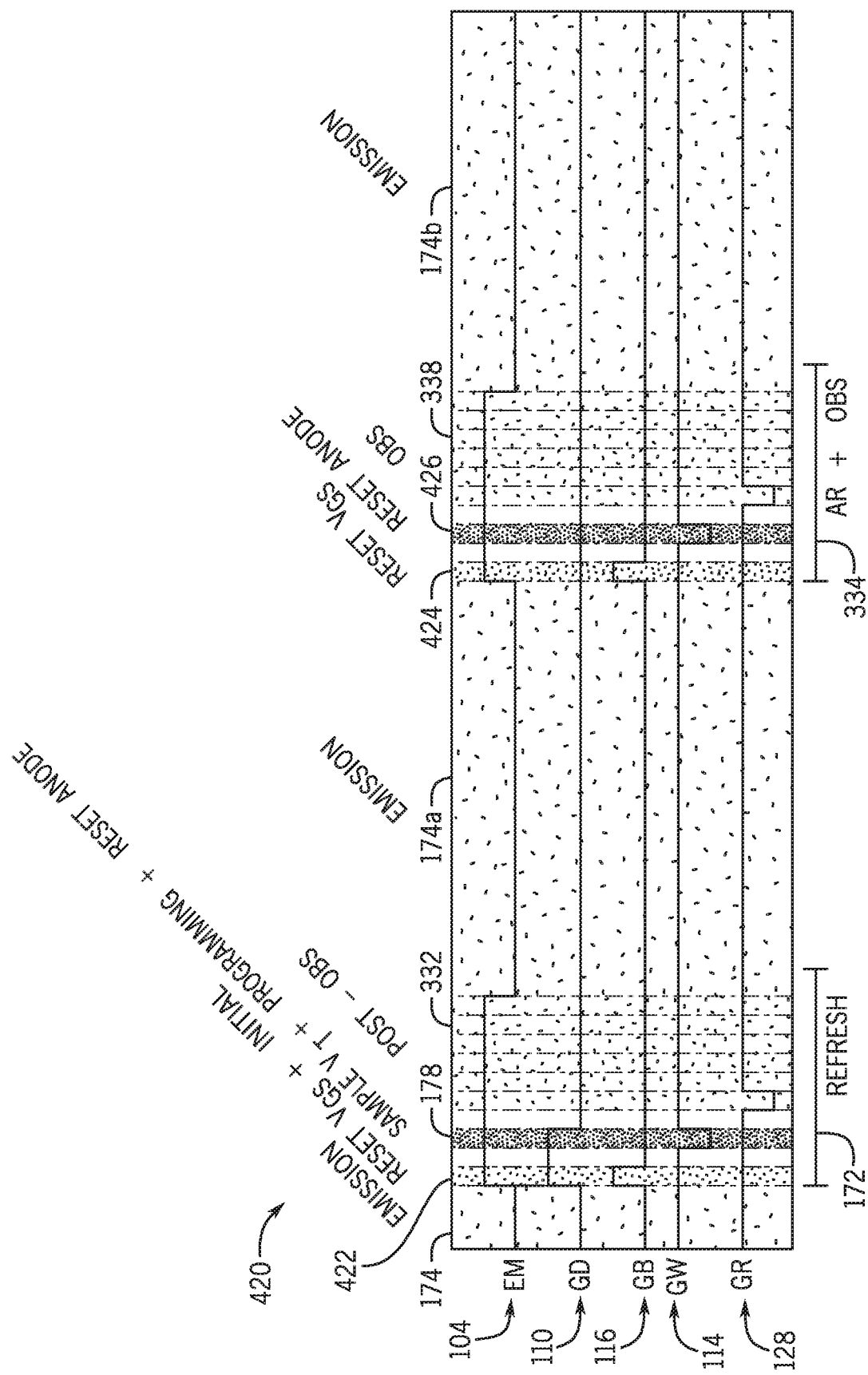
FIG. 32 is a timing diagram of signals transmitted through the self-emissive pixel of FIG. 31, in accordance with an embodiment.

FIG. 32 illustrates a timing diagram 420 that describes the timing of control signals provided by the controller 69 to control the self-emissive pixel 62I'. The timing diagram 420 includes a $V_{GS}$ reset and initialization period 422, a program and threshold voltage sampling period 178, a post-OBS period 332, a first emission period 174a, a $V_{GS}$ reset period 424, an anode-reset period 426, an on-bias stress period 338, and a second emission period 174b.

Figure 33:
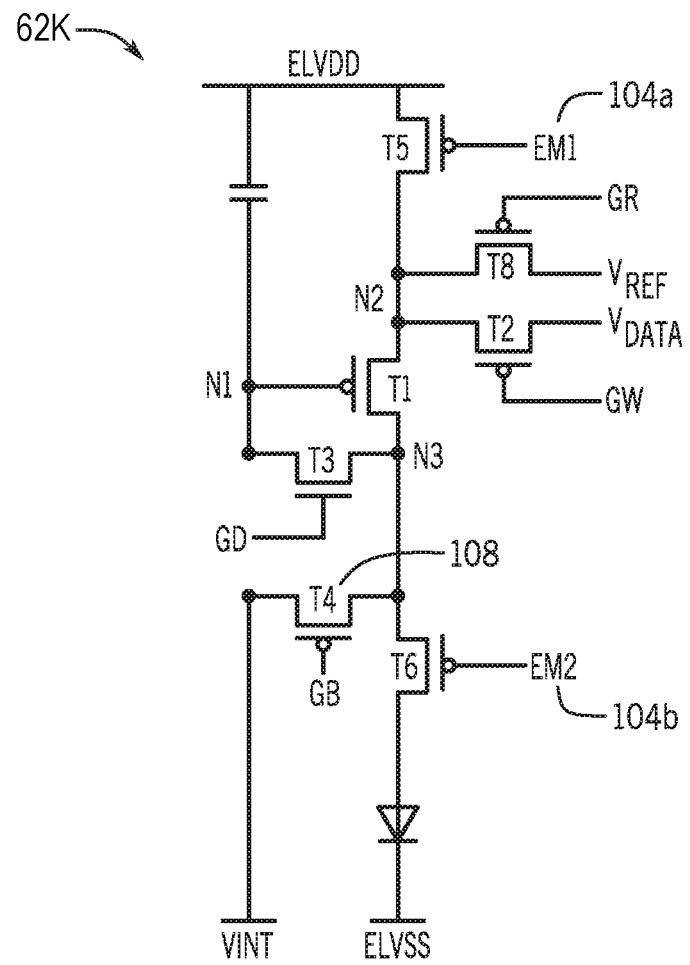
FIG. 33 is a circuit diagram of a self-emissive pixel of the display of FIG. 7, in accordance with an embodiment.

FIG. 33 illustrates a circuit diagram of a self-emissive pixel 62K that is generally similar to the self-emissive pixel 62H. However, the self-emissive pixel 62K does not include the bypass transistor 118. Additionally, the self-emissive pixel 62K is configured to receive two different emission signals 104 (e.g., emission signal 104a and emission signal 104b) from the controller 69.

Figure 34:
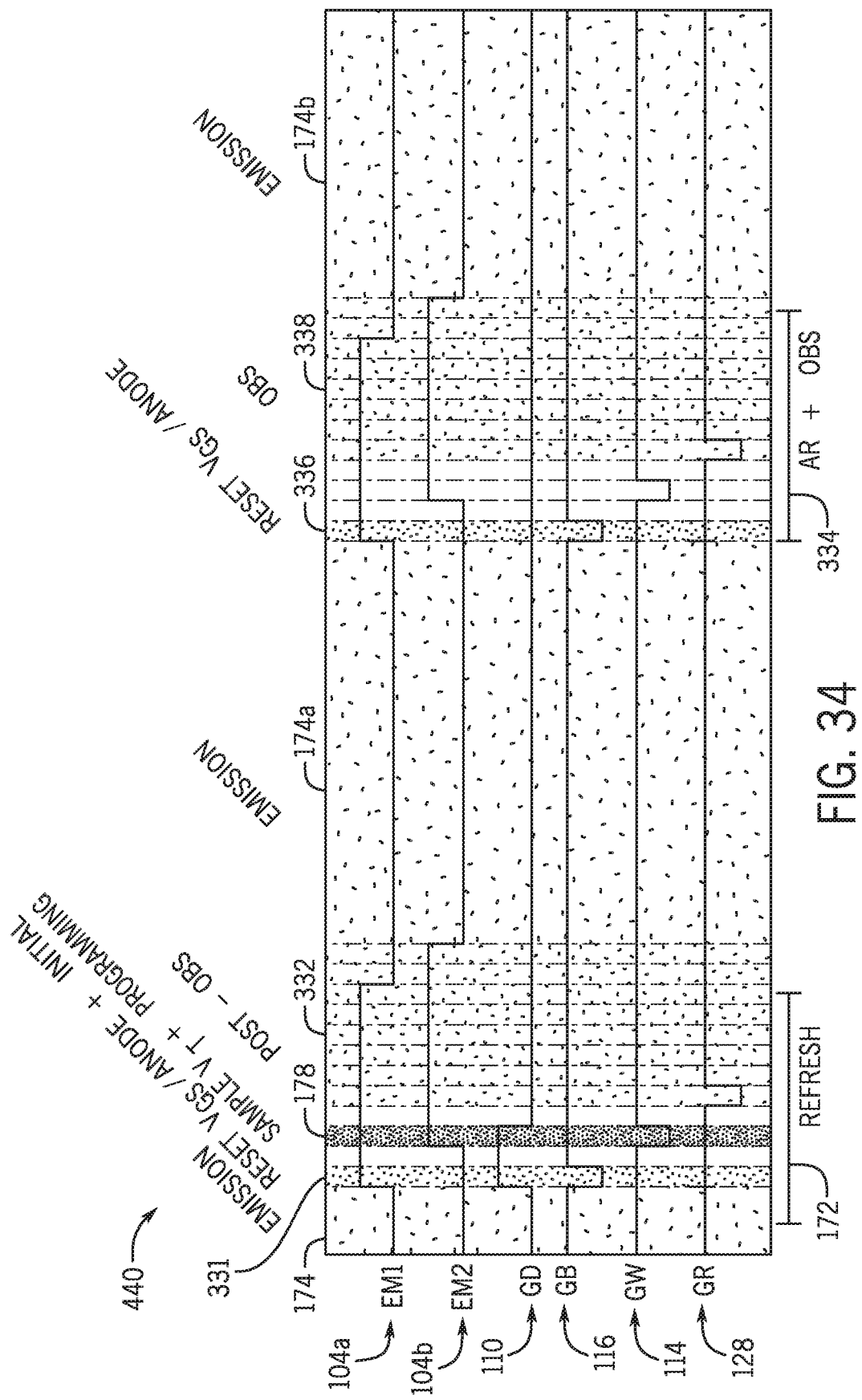
FIG. 34 is a timing diagram of signals transmitted through the self-emissive pixel of FIG. 33 in accordance with an embodiment.

FIG. 34 illustrates a timing diagram 440 that describes the timing of control signals provided by the controller 69 to control the self-emissive pixel 62K. The timing diagram 440 includes an initialization and anode-reset period 331, a program and threshold voltage sampling period 178, post-OBS period 332, an anode-reset period 336, an on-bias stress period 338, and a second emission period 174b.

Figure 35:
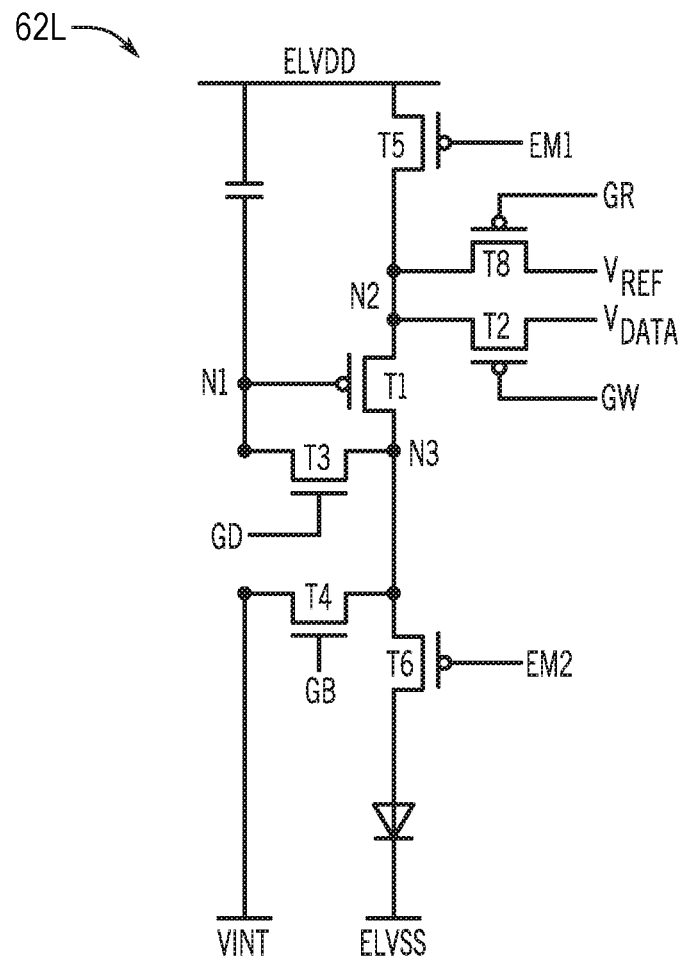
FIG. 35 is a circuit diagram of a self-emissive pixel of the display of FIG. 7, in accordance with an embodiment.

FIG. 35 illustrates a circuit diagram of a self-emissive pixel 62L that is generally similar to the self-emissive pixel 62I'. However, the self-emissive pixel 62L does not include the bypass transistor 118. Additionally, the self-emissive pixel 62L is configured to receive two different emission signals 104 (e.g., emission signal 104a and emission signal 104b) from the controller 69.

Figure 36:
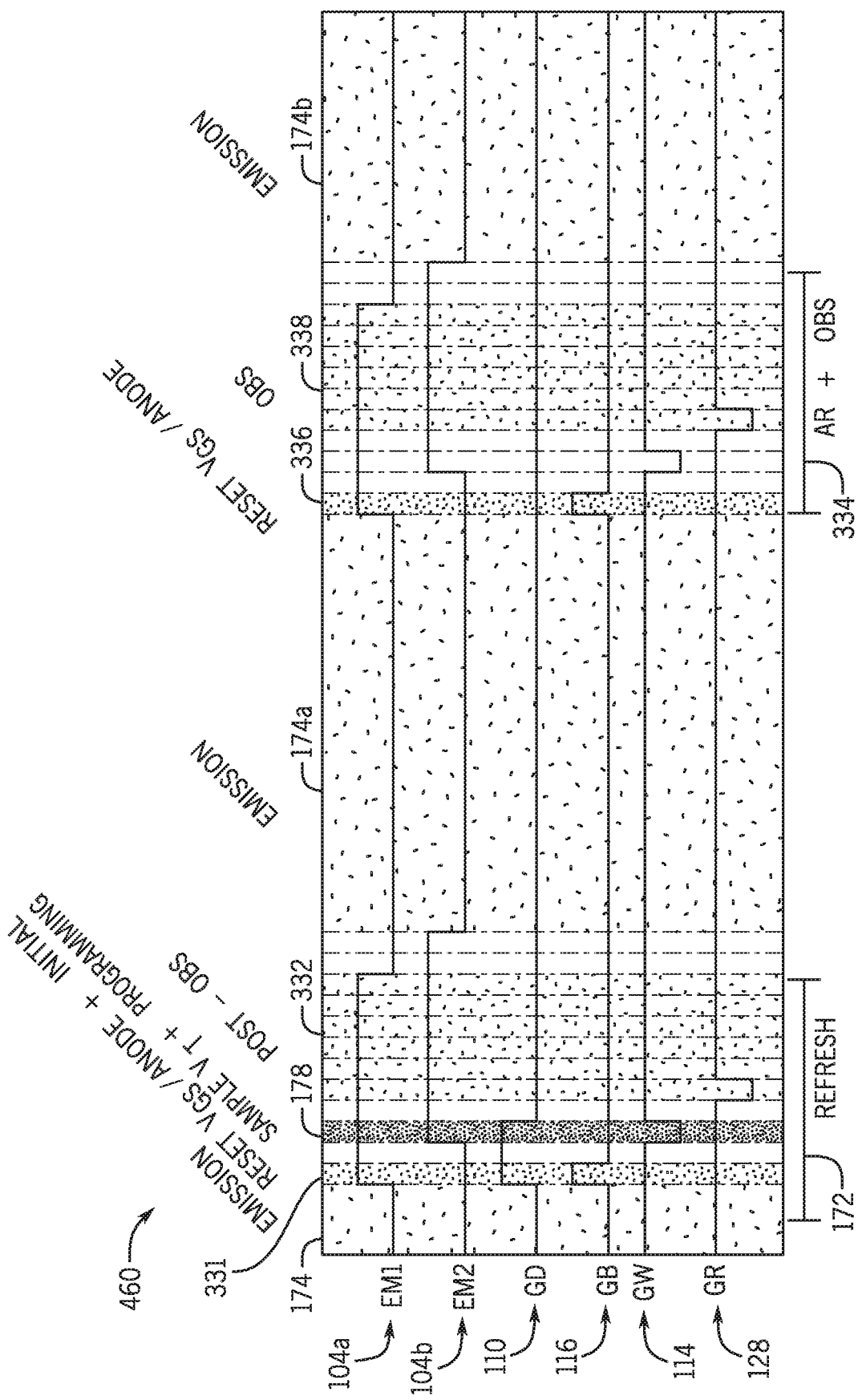
FIG. 36 is a timing diagram of signals transmitted through the self-emissive pixel of FIG. 35, in accordance with an embodiment.

FIG. 36 illustrates a timing diagram 460 that describes the timing of control signals provided by the controller 69 to control the self-emissive pixel 62L. The timing diagram 460 includes an initialization and anode-reset period 331, a program and threshold voltage sampling period 178, post-OBS period 332, an anode-reset period 336, an on-bias stress period 338, and a second emission period 174b.

Figure 37:
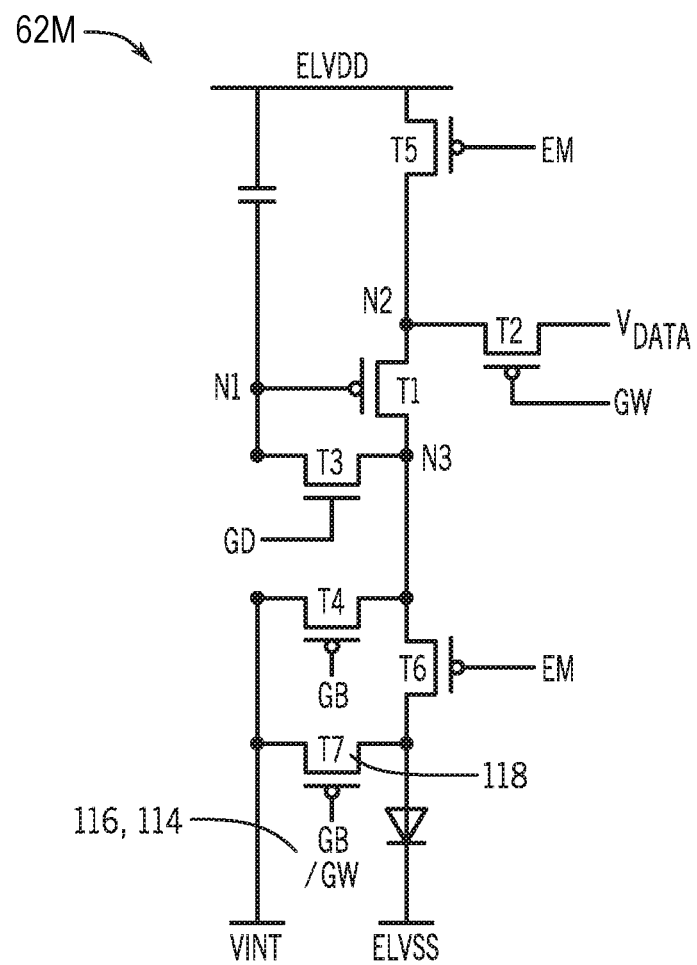
FIG. 37 is a circuit diagram of a self-emissive pixel of the display of FIG. 7, in accordance with an embodiment.

FIG. 37 illustrates a circuit diagram of a self-emissive pixel 62M that is somewhat similar to the self-emissive pixel 62I. In particular, the self-emissive pixel 62M does not include the transistor 126, and the self-emissive pixel 62M is not configured to receive the reset signal 128 or $V_{REF}$ 254 from the controller 69. Additionally, because the self-emissive pixel 62M is not configured to receive the reset signal 128, the bypass transistor 118 may not receive the reset signal 128 but may receive the bypass signal 116 or the write signal 114.

Figure 38:
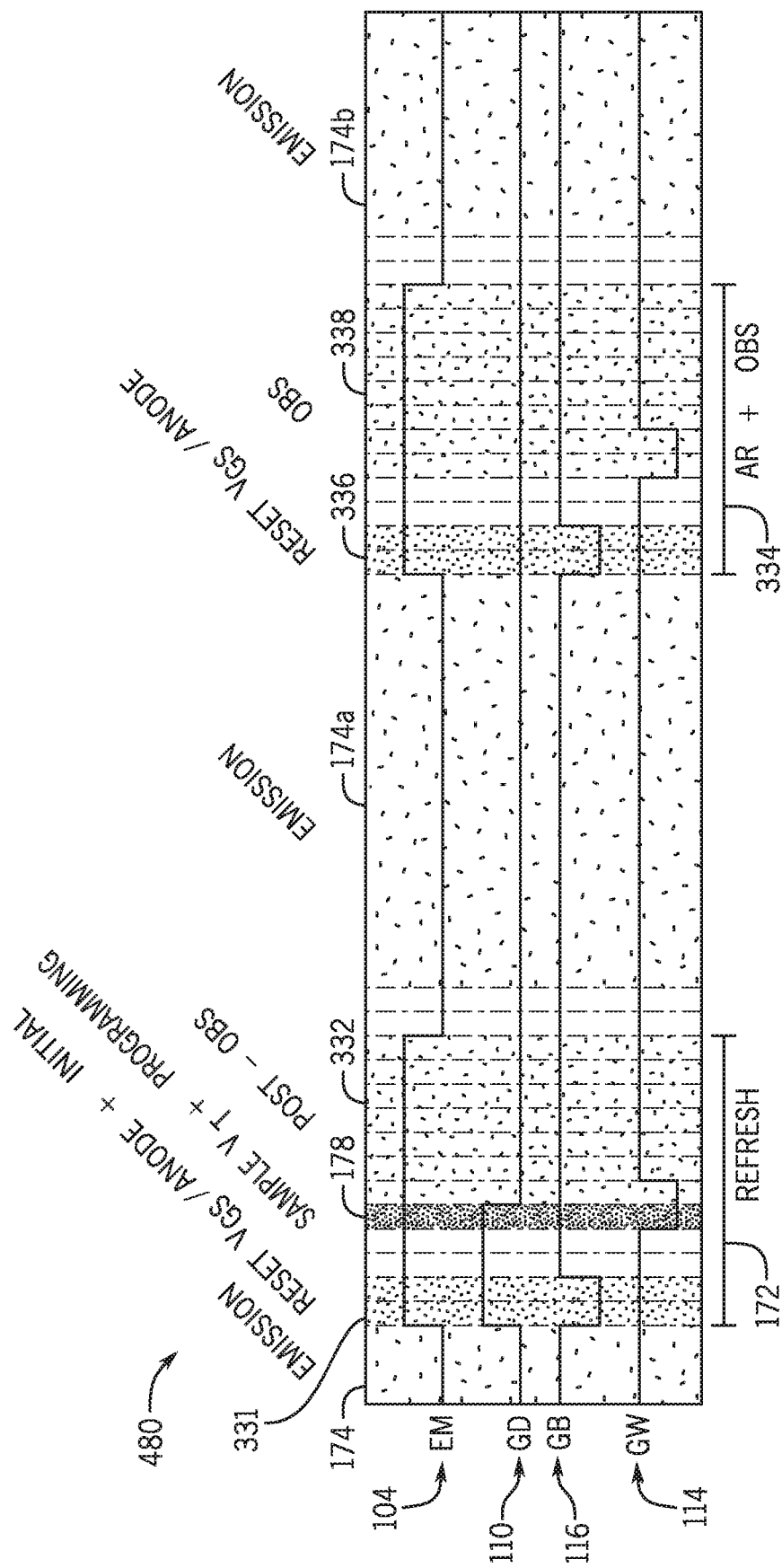
FIG. 38 is a timing diagram of signals transmitted through the self-emissive pixel of FIG. 37, in accordance with an embodiment.

FIG. 38 illustrates a timing diagram 480 that describes the timing of control signals provided by the controller 69 to control the self-emissive pixel 62M. The timing diagram 480 diagram includes an initialization and anode-reset period 331, a program and threshold voltage sampling period 178, post-OBS period 332, an anode-reset period 336, an on-bias stress period 338, and a second emission period 174b.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic display, comprising:
   a self-emissive pixel configured to emit light in response to image data, wherein the self-emissive pixel comprises a light-emitting diode configured to emit light based on the image data; and
   a controller configured to:
      perform a refresh process during which a first set of data from a data terminal is received by the self-emissive pixel, wherein the controller is configured to perform the refresh process by performing a first on-bias stress (OBS) process during which a reference voltage is applied to a transistor of the self-emissive pixel;
      perform a first emission process to emit light from the self-emissive pixel in accordance with the first set of data received from the data terminal;
      perform a reset process during which the self-emissive pixel ceases to emit light; and
      perform a second emission process to emit light from the self-emissive pixel in accordance with the first set of data that was received by the self-emissive pixel during the refresh process.

2. The electronic display of claim 1, wherein the controller is configured to perform the refresh process by performing a program and sample threshold voltage process to prepare the self-emissive pixel to emit light in accordance with the first set of data received from the data terminal.

3. The electronic display of claim 1, wherein the controller is configured to perform the reset process by performing a second OBS process during which the reference voltage is applied to the transistor.

4. The electronic display of claim 3, wherein:
   performing the first OBS process comprises increasing a threshold voltage of the transistor to a first threshold voltage value; and
   performing the second OBS process comprises increasing the threshold voltage of the transistor to a second threshold voltage value that is substantially the same as the first threshold voltage value.

5. The electronic display of claim 1, wherein the controller is configured to:
   determine a voltage to apply based on a gray level indicated by the first set of data; and
   apply the voltage as the reference voltage.

6. The electronic display of claim 1, wherein the controller is configured to perform a plurality of reset processes and a plurality of emission processes before performing a second refresh process during which a second set of data from the data terminal is received by the self-emissive pixel.

7. The electronic display of claim 1, wherein:
   performing the refresh process results in a first luminance value of the self-emissive pixel; and
   performing the reset process results in a second luminance value of the self-emissive pixel that is substantially equivalent to the first luminance value.

8. The electronic display of claim 1, wherein the controller is configured to perform the first emission process and the second emission process by sending a signal to cause an organic light-emitting diode (OLED) of the self-emissive pixel to emit light.

9. An electronic device comprising:
processing circuitry configured to generate image data for display for a presentation time; and
an electronic display configured to display the image data for the presentation time, wherein the electronic display comprises:
- a self-emissive pixel configured to emit light in response to the image data, wherein the self-emissive pixel comprises:
  - a light-emitting diode configured to emit light based on the image data; and
  - a plurality of transistors responsive to control signals comprising at least the image data to enable the self-emissive pixel to emit the light; and
- a controller configured to send the control signals to cause:
  - a threshold voltage sampling and pixel programming phase to cause a capacitor coupled to a gate of a first transistor of the plurality of transistors to store the image data for the self-emissive pixel while accounting for a first threshold voltage of the first transistor;
  - after the threshold voltage sampling and pixel programming phase, an on-bias stress phase to cause a threshold voltage of the first transistor of the plurality of transistors to reach a second threshold voltage;
  - after the on-bias stress phase, a first emission phase to cause the light-emitting diode to emit light in accordance with the image data; and
  - subsequent on-bias stress phases and subsequent emission phases for the duration of the presentation time without a visible flicker artifact.

10. The electronic device of claim 9, wherein the controller is configured to send the control signals to cause a reset phase before the threshold voltage sampling and pixel programming phase.

11. The electronic device of claim 9, wherein the controller is configured to send the control signals to cause a reset phase after the first emission phase and before each subsequent on-bias stress phase and subsequent emission phase.

12. The electronic device of claim 9, wherein the plurality of transistors comprises:
- a first emission transistor disposed between a first voltage source and the first transistor; and
- a second emission transistor disposed between the first transistor and a second voltage source that is different than the first voltage source.

13. The electronic device of claim 12, wherein the first transistor is configured to receive a first emission signal, the second emission transistor is configured to receive a second emission signal, and the self-emissive pixel is configured to emit light via the light-emitting diode at a time when the first transistor receives the first emission signal and the second emission transistor receives the second emission signal.

14. The electronic device of claim 9, wherein the electronic display is configured to be able to operate at a refresh rate between a range of one hertz and ten hertz.

15. A display system, comprising:
a self-emissive pixel of the display system configured to emit light in response to image data, wherein the self-emissive pixel comprises:
- a light-emitting diode configured to emit light based on the image data;
- a storage capacitor configured to store the image data; and
- a plurality of transistors responsive to the image data to enable the self-emissive pixel to emit the light; and
a controller configured to:
- transmit the image data to the self-emissive pixel;
- send one or more threshold voltage sampling and pixel programming signals to cause the storage capacitor to store the image data for the self-emissive pixel;
- after sending the one or more threshold voltage sampling and pixel programming signals, send one or more on-bias stress signals to be sent to cause a threshold voltage of a first transistor of the plurality of transistors to reach a first threshold voltage; and
- after sending the one or more on-bias stress signals, send one or more first emission signals to cause the light-emitting diode to emit light in accordance with the image data.

16. The display system of claim 15, wherein the controller is configured to:
- terminate the one or more first emission signals;
- after terminating the one or more first emission signals, send a second on-bias stress signal to cause the threshold voltage of the first transistor to reach a second threshold voltage that is substantially equivalent to the first threshold voltage; and
- after sending the second on-bias stress signal, send a second emission signal to cause the light-emitting diode to emit light in accordance with the image data.

17. The display system of claim 16, wherein:
the display system comprises an initialization voltage source configured to provide an initialization voltage to the self-emissive pixel; and
the controller is configured to, after terminating the one or more first emission signals but before sending the second on-bias stress signal, send a reset signal configured to cause the initialization voltage to traverse the first transistor.

18. The display system of claim 15, wherein the light-emitting diode comprises an organic light-emitting diode (OLED).

19. The display system of claim 15, wherein the controller is configured to:
determine if the display system is to operate in a low refresh rate mode based on the image data; and
alter a refresh rate of the display system.

20. The electronic display of claim 1, wherein the electronic display is included in a computer, a mobile phone, a portable media device, a tablet, a television, a virtual reality headset, or a vehicle dashboard.

* * * * *